United States Patent
Vukic et al.

(10) Patent No.: US 9,513,330 B2
(45) Date of Patent: Dec. 6, 2016

(54) CHARGE SHARING TESTING OF THROUGH-BODY-VIAS

(75) Inventors: Mladenko Vukic, Portland, OR (US); Kalyan C. Kolluru, Portland, OR (US)

(73) Assignee: INTEL CORPORATION, Santa Clara, CA (US)

(*) Notice: Subject to any disclaimer, the term of this patent is extended or adjusted under 35 U.S.C. 154(b) by 19 days.

(21) Appl. No.: 13/977,659

(22) PCT Filed: Jun. 29, 2012

(86) PCT No.: PCT/US2012/045103
§ 371 (c)(1),
(2), (4) Date: Nov. 5, 2013

(87) PCT Pub. No.: WO2014/003793
PCT Pub. Date: Jan. 3, 2014

(65) Prior Publication Data
US 2014/0070838 A1    Mar. 13, 2014

(51) Int. Cl.
*G01R 31/28* (2006.01)
*H01L 21/66* (2006.01)
*G01R 31/312* (2006.01)
*H01L 23/48* (2006.01)

(52) U.S. Cl.
CPC ....... *G01R 31/2853* (2013.01); *G01R 31/2894* (2013.01); *G01R 31/312* (2013.01); *H01L 22/14* (2013.01); *H01L 23/481* (2013.01); *H01L 2224/0401* (2013.01); *H01L 2224/06181* (2013.01); *H01L 2224/131* (2013.01); *H01L 2224/13025* (2013.01); *H01L 2224/16146* (2013.01); *H01L 2224/16225* (2013.01); *H01L 2224/16227* (2013.01)

(58) Field of Classification Search
CPC .................................................. G01R 31/2894
USPC ..................................................... 324/762.03
See application file for complete search history.

(56) References Cited

U.S. PATENT DOCUMENTS

| 5,097,470 A | * | 3/1992 | Gihl ................................. 714/55 |
| 6,553,547 B1 | * | 4/2003 | Heragu et al. ............... 716/106 |
| 2010/0127758 A1 | | 5/2010 | Hollis |
| 2011/0080185 A1 | * | 4/2011 | Wu et al. ................... 324/750.3 |
| 2011/0102006 A1 | | 5/2011 | Choi et al. |
| 2011/0115516 A1 | | 5/2011 | Lee et al. |

(Continued)

FOREIGN PATENT DOCUMENTS

KR    10-2012-0068482    6/2012

OTHER PUBLICATIONS

International Preliminary Report on Patentability for International Application No. PCT/US2012/045103, Jan. 8, 2015, 7 pp.

(Continued)

*Primary Examiner* — Tung X Nguyen
*Assistant Examiner* — Zannatul Ferdous
(74) *Attorney, Agent, or Firm* — Konrad Raynes Davda & Victor LLP

(57) ABSTRACT

In accordance with one aspect of the present description, an integrated circuit die has a plurality of through-body-vias and a testing circuit on board the die which allows charges on a first and second through-body-via to redistribute between them to provide an indication whether one or both of the first and second through-body-vias has a defect. Other aspects are described.

21 Claims, 12 Drawing Sheets

(56) References Cited

U.S. PATENT DOCUMENTS

2012/0008445 A1* 1/2012 Parris et al. .................. 365/203
2012/0153280 A1 6/2012 Kim et al.
2013/0006557 A1* 1/2013 Chakrabarty et al. .......... 702/65

OTHER PUBLICATIONS

International Search Report and Written Opinion for International Application No. PCT/US2012/045103, dated Mar. 4, 2013, 10 pp.

Chen, P., et al., "On-Chip Testing of Blind and Open-Sleeve TSVs for 3D IC before Bonding", Proceedings of the 2010 28th IEEE VLSI Test Symposium, 2010, 6 pp.

Cho, M., et al., "Design Method and Test Structure to Characterize and Repair TSV Defect Induced Signal Degradation in 3D System", Proceedings of the 2010 IEEE/ACM International Conference on Computer-Aided Design (ICCAD), Nov. 2010, 4 pp.

Tsai, M., et al., "Through Silicon Via (TSV) Defect/Pinhole Self Test Circuit for 3D-IC", Proceedings of the 2009 IEEE International Conference on 3D System Integration, Sep. 2009, 8 pp.

* cited by examiner $$V_{pad} = \frac{1}{1 + \dfrac{C_{i/o\_b} + C_{TSV\_tot\_b}}{C_{i/o\_a} + C_{TSV\_tot\_a}}} V$$

| SCENARIO | I/O PAD CONDITION | | I/O PAD 160a LOGIC STATE | I/O PAD 160b LOGIC STATE |
|---|---|---|---|---|
| 1 | BOTH PADS HAVE GOOD TSVs | TX | 1 | 0 |
| | | RX | 1 | 0 |
| 2 | BOTH PADS HAVE OPEN TSVs | TX | 1 | 0 |
| | | RX | 1 | 0 |
| 3 | I/O PAD 160a GOOD TSV; I/O PAD 160b OPEN TSV | TX | 1 | 0 |
| | | RX | 1 | 1 |
| 4 | I/O PAD 160a OPEN TSV; I/O PAD 160b GOOD TSV | TX | 1 | 0 |
| | | RX | 0 | 0 |

CHARGE SHARING TESTING OF THROUGH-BODY-VIAS

BACKGROUND

Description of Related Art

Integrated circuits typically include various active and passive circuit elements which have been integrated into a piece or substrate of semiconductor material, often referred to as a die. The die may, in turn, be frilly or partially encapsulated into a package, which often includes a ceramic or plastic substrate although other materials may be used. The package mechanically supports and protects the die which is often relatively fragile.

These packages are usually attached to a printed circuit board through their second level interconnects, which often are pins, balls or other connectors arranged along the exterior of the package. The package may be attached directly to the printed circuit board, often by soldering or other connection techniques. In some applications, the package may not connect directly to the printed circuit board. Instead, an interposer or socket or other device may provide an intermediate connection between the package and the printed circuit board.

Conductors of the package typically provide separate electrical connection terminals between the printed circuit board (or interposer or socket), and the various inputs and outputs of the integrated circuit or circuits within the package. An integrated circuit die often has electrical connectors such as solder bumps to mechanically and electrically connect the integrated circuit die to the package substrate. Solder bumps or other electrical connectors may also be used to mechanically and electrically connect an integrated circuit die to one or more other such dies in a stack arrangement. In this manner, an electronic system can be formed by connecting various integrated circuit dies to a printed circuit board.

Before an integrated circuit die is placed in a package or in a stack of dies, the die is often tested. A process in which a die on a wafer is tested is commonly referred to as "wafer sort." Wafer sort testing may occur at various stages of die processing. One such testing stage may occur after the front side of the wafer or die is processed. The side of the die on which the integrated circuit is formed is typically referred to as the front side of the die. Another testing stage may occur after processing of the back side of the wafer or die. Formation of metal conductors in signal redistribution layers on the back side of the die is often referred to as back side processing.

Wafer sort testing typically involves the use of probing technology wherein mechanical probes extending from a probe card engage electrical contact features on a die, and connect the contact features to a tester of a testing apparatus. During testing, a handler is frequently used to support the wafer on a platform or chuck and positions the wafer so as to precisely align the die bumps, bond pads or other electrical contact features of a die to be tested with the probe features on the probe card.

A staging device typically positions the chuck along an x-y plane by moving along a stage floor on an actuator assembly such as a ball screw stage assembly or magnetic air bearing, for example. The chuck typically comprises a vacuum chuck wherein the wafer being tested is held in position by drawing a vacuum within a plurality of interconnecting channels that are formed within the surface of the chuck. Once aligned, the chuck is raised via rods such that the contact features of the die are forced against the probe features on the probe card.

To activate the circuitry on the die, power signals including voltage and ground signals, and input signals including control, address, clock and data signals are supplied to die bumps, bond pads or other electrical contact features of a die which may be positioned on the front side, back side, or both sides of the device. Signals generated by the integrated circuit device in response to the supplied signals may be received by probes of the probe card and may be recorded and analyzed by the tester.

An integrated circuit device packaged in a package may be tested as a whole by plugging the device into a test socket of a test board which provides suitable test signals to the input pins of the device to test the operation of the device. Signals generated by the device in response to the supplied signals may be received by the test socket from the output pins and may be recorded and analyzed by the test board.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

In accordance with one aspect of the present description, a plurality of through-body-vias such as through-silicon-vias, for example, may be tested in parallel for defects in a charge sharing process. As explained in greater detail below, it is recognized that a through-body-via presents a capacitive load to a circuit such an in input/output buffer. A defect such as an open condition of the through-body-via may be detected by estimating the capacitance of a circuit feature such as an input/output circuit which includes a through-body-via. In one embodiment, the charge sharing process includes setting the voltage levels on two or more through-body-vias at different voltage levels, and allowing the charges on the through-body-vias to redistribute among them to a common voltage level. It is recognized that the level of the common voltage provides an estimation of the relative capacitances of the through-body-vias and hence may be utilized in determining whether one or more of the through-body-via has a defect such as an open condition, for example, as a function of the level of the common voltage.

Figure 1:
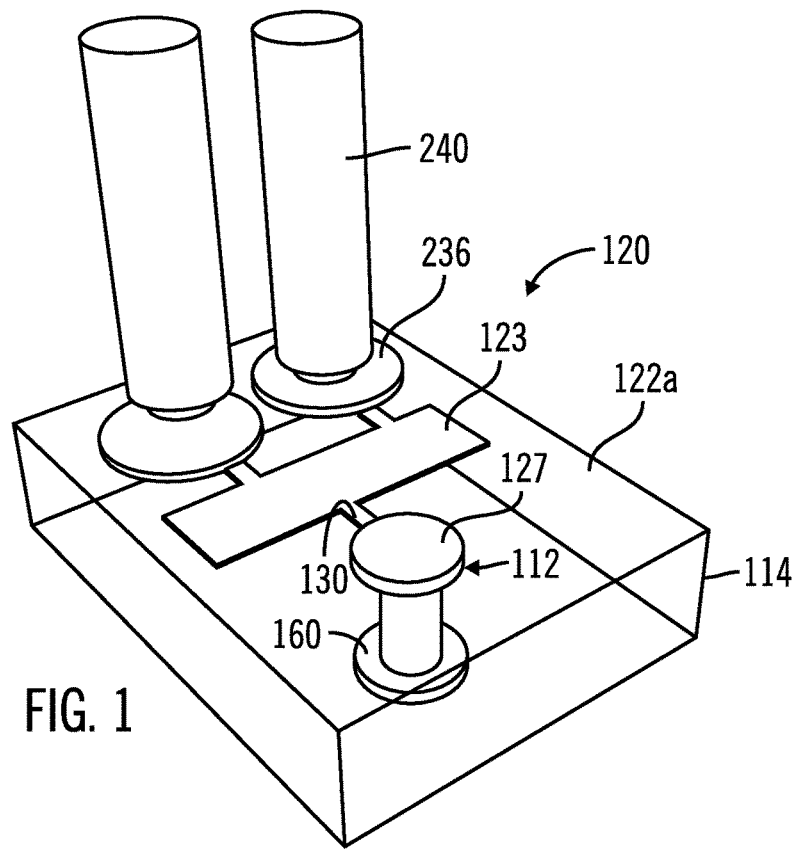
FIG. 1 illustrates one embodiment of a die having a through-body-via and a through-body-via testing circuit in accordance with the present description.

FIG. 1 is a schematic diagram depicting one example of a portion of a die 120 having a through-body-via 112 and an integrated through-body-via testing circuit 123 in accordance with the present description, which may be utilized in determining whether the through-body-via has a defect such as an open condition, for example. Although one through-body-via 112 is depicted, it is appreciated that a die may have tens, hundreds or more such through-body-vias, depending upon the application.

The through-body-via 112 is conductive and passes vertically through the body 114 of a die 120 from the front side 122a (FIG. 2) of the die to the back side 122b of the die 120. Each through-body-via 112 is generally cylindrical (three-dimensional) in shape and is formed by depositing a conductive metal in a cylindrically-shaped passageway which passes from the front side 122a of the die to the back side 122b of the die 120. It is appreciated that a through-body-via may have other shapes, depending upon the particular application.

In FIG. 1, the semiconductor material 125 (FIG. 2) of the die 120 has been omitted for clarity. In the illustrated embodiment, the semiconductor material 125 is silicon such that the through-body-via 112 is a through-silicon-via. However, it is appreciated that the body of a die may be made of other types of materials. including semiconductor materials such as germanium and nonsemiconductor materials.

Figure 2:
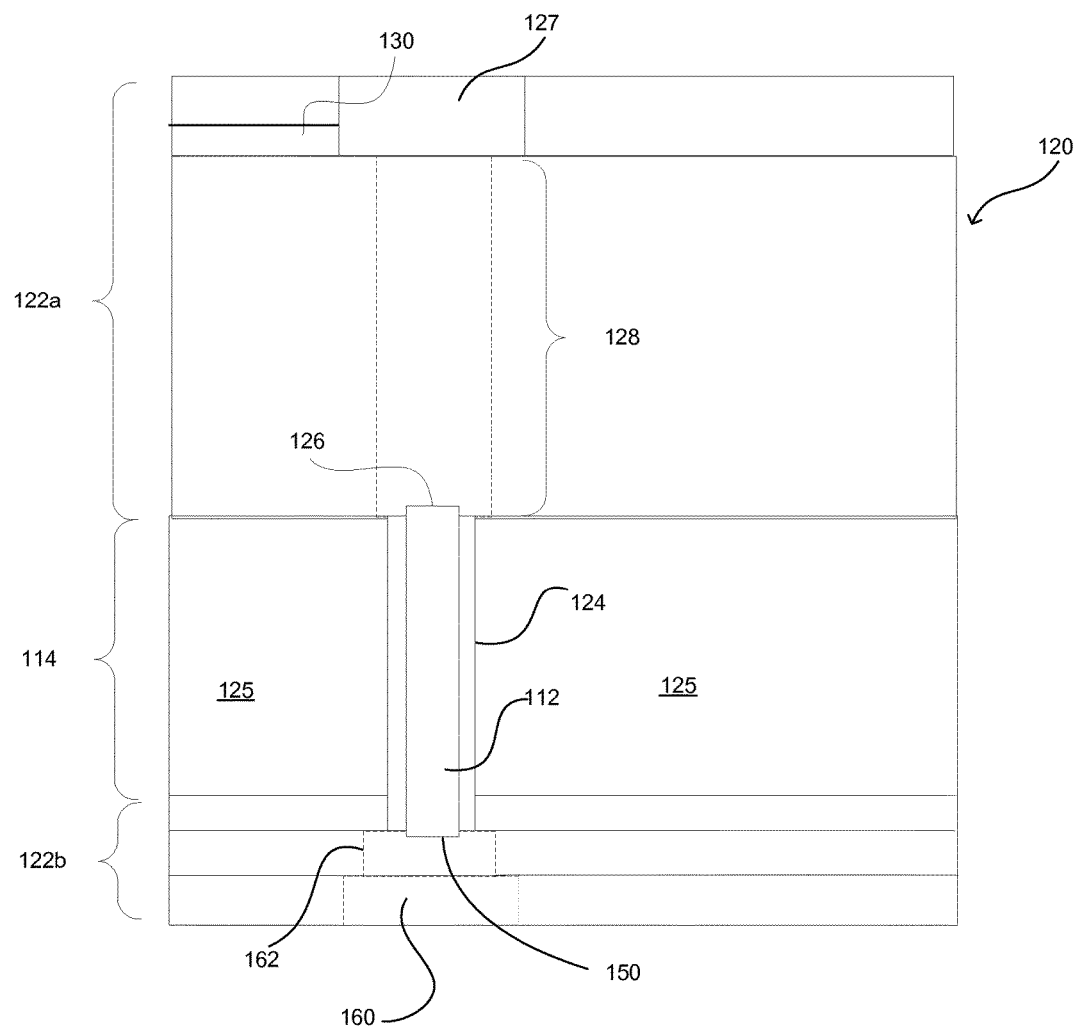
FIG. 2 is a cross-sectional view of the through-body-via of FIG. 1.

As shown in FIG. 2, a barrier/liner layer 124 may be deposited of suitable barrier or liner (or both) materials, on the walls of the passageway in the body 114, and between the semiconductor material 125 of the body 114 and the conductive material of the through-body-via 112. An example of such a barrier/liner layer 124 is a dielectric or insulative layer such as silicon dioxide, for example. It is appreciated that other materials may be used, depending upon the particular application.

In the illustrated embodiment, the body 114 of the die 120 includes the bulk crystalline silicon portion of the silicon die 120, and doped semiconductor regions of integrated circuits formed on the die 120. It is appreciated however, that in some embodiments, such as in silicon interposers, for example, the die 120 may lack any active components. The front side 122a of the die 120 is supported by the front side of the body 114, and includes deposited metallization layers separated by deposited insulation layers. Vias formed through the insulation layers are used to interconnect the metallization layers of the integrated circuits.

An integrated circuit typically has many metal interconnect layers which are interconnected with vias of typically nanometer dimensions. Advanced integrated circuits can have in excess of 10 levels of interconnect metal layers on the front side of the die. These are typically referred to as M1, M2, . . . M10, etc. where M1 is metal layer closest to the transistors while M10 (or higher) is the metal layer closest to the exterior of the die.

In this embodiment, a plurality of conductors 128 deposited in metallization and insulation layers on the front side 122a of the die, electrically couples the front side end 126 of the through-body-via 112, to a contact pad conductor 127 and to a conductor 130 on the front side 122a of the die. The conductors 128 may take any suitable form. For example, the conductors 128 may include conductive metal plates formed in a metallization layer, and conductive metal through-layer-vias formed in an insulation layer separating adjacent metallization layers. The conductors 128 connect to each other to pass current between the front side end 126 of each through-body-via 112, to the contact pad conductor 127. The conductor 130 on the front side of the of the die 120 may couple the through-body-via 112 to the testing circuit 123 and to other circuits on the front side 122a of the die 120 such as an I/O buffer, for example. The arrangement of conductors on the front side of the die associated with the through-body-via may vary, depending upon the particular application. For example, in some applications, a through-body-via may lack a front side contact pad conductor 127.

The back side 122b of the die 120 is supported by the back side of the body 114, and similarly includes deposited metallization layers separated by deposited insulation layers. Conductors formed in the metallization layers and through the insulation layers on the back side 122b are used to redistribute signals to or from the integrated circuits on the die 120.

A back side end 150 of the through-body-via 112 is electrically coupled to a back side contact pad conductor 160 by a conductor 162 formed by metallization traces on the back side 122b of the die 120. The metallization traces of the conductors may be formed in one or more redistribution layers on the back side 122b of the die 120. In the illustrated embodiment, the contact pad conductors 127, 160 electrically coupled to the through-body-via 112, may be coaxially aligned with the through-body-via 112, or may be offset with respect to the through-body-via 112, depending upon the particular application.

In one application, the through-body-via 112 may be coupled to an I/O buffer on the front side of the die 120 and the contact pad conductor 160 may function as a contact pad for the I/O buffer. As explained in greater detail below, the I/O buffer forms a part of the testing circuit 123 in the illustrated embodiment. It is appreciated that the through-body-via 112 may be coupled to other types of circuitry on the die, depending upon the particular application.

Figures 3, 10:
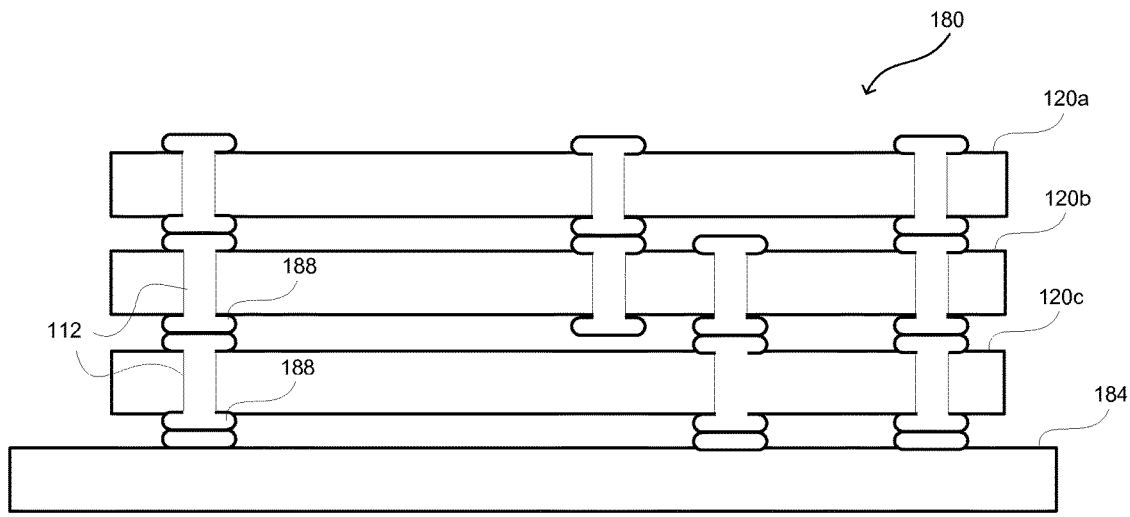
FIG. 3 illustrates one example of a stack of dies having through-body-via testing circuits in accordance with the present description.
FIG. 10 illustrates one example of an equation representing a common voltage resulting from a charge redistribution operation for a pair of I/O pads of a pair of I/O buffers, as a function of the ratio of the capacitance loads of the pair of I/O pads.

FIG. 3 shows one example of a stack 180 of interconnected dies 120a, 120b, 120c, 184 which may have any suitable integrated circuits including processors, memory, and input/output circuits. In this example, the dies 120a, 120b, 120c are similar to the die 120 of FIG. 2, and thus each die 120a, 120b, 120c has a plurality of through-body-vias 112 with associated front side and back side contact pad conductors similar to the contact pad conductors 127, 160 of FIG. 2.

The contact pad conductor of a through-body-via 112 of one die 120a, 120b, 120c may be electrically connected to a contact pad conductor of a through-body-via 112 of an adjacent die 120a, 120b, 120c of the stack 180 by suitable connectors such as solder balls 188. It is appreciated that other conductors may be used to electrically connect the through-body-vias 112 of the stack 180 together, depending upon the particular application. In the illustrated embodiment of FIG. 3, the through-body-vias 112 may be electrically connected to a coaxially aligned through-body-via 112 of an adjacent die, or may be electrically connected to an axially offset through-body-via 112 of an adjacent die, or may be electrically coupled to a die or die portion lacking a through-body-via as shown for the die 184, for example.

Also in the illustrated embodiment, the through-body-vias are depicted as interconnecting a stack of dies. It is appreciated that embodiments in accordance with the present description may have through-body-vias in other applications such as interconnecting a die to a package or package substrate, or other applications.

During the manufacturing process, it is recognized that, due to various factors, some through-body-vias such as through-silicon-vias, may be imperfectly formed such that one or more may contain defects such as shorts, pin holes, open circuits, or other defects. Thus, before the dies are assembled in a slack of dies or assembled in a package, dies are frequently tested to confirm the structural integrity and proper operation of various components of the devices formed in and on the die.

Various techniques have been used or proposed for testing die components such as through-body-vias. For example, it is believed that electrical shorts of through-silicon-vias may be tested with known on die input/output methods. Many of such tests are performed on a die by directly contacting conductor bumps, conductor contact pads, or other conductors on the die to input test signals and receive test data in return.

However, it is recognized herein that known testing techniques may not be well suited to testing some defects of through-silicon-vias, such as open circuit conditions of through-silicon-vias, for example. More specifically it is recognized herein that an appropriate test of an open circuit condition for a through-silicon-via may include a reliable estimation of pad capacitance of the through-silicon-via. However, because the "pitch", that is, the distance between adjacent through-silicon-vias may be quite small in many dies, direct probing of the through-silicon-via contact pads may be difficult to achieve. For example, the microprobes may be too large to readily contact individual through-silicon-via contact pads. Moreover, many through-silicon-vias are frequently relatively fragile. As a result, direct mechanical contact between a through-silicon-via contact pad and a probe may damage the contact pad.

Accordingly, it is recognized herein that an appropriate testing technique for a through-silicon-via or other through-body-via may avoid direct probing of the through-silicon-via contact pads. One approach to avoiding direct probing of a particular circuit or circuit element is to use testing circuitry formed on board the die. On-board testing circuitry, often referred to in general as design for test (DFT) circuitry, can in response to test input signals provided by a probe, input pin or other external conductor, provide test input signals to the die circuit or component to be tested. In addition, such on board testing circuitry can receive test output data in return which can be processed and output through a probe, output pin or other external conductor.

However, many known testing interfaces typically do not have analog references, analog circuits, or compensations for driver strength. Also known testing interfaces typically lack sophisticated receivers and instead typically have simplistic receivers with hysteresis. As a result, it is believed that these known techniques for on-board testing of a die are not well suited for testing certain through-silicon-via defects such as an open circuit condition, for example, particularly in a high volume manufacturing setting.

In accordance with one aspect of the present description, testing circuitry on board a die provides for capacitance testing a plurality of through-body-vias in parallel for defects as a function of the respective capacitances of the through-body-vias. In the illustrated embodiment, the capacitance testing includes a charge sharing process which includes setting the voltage levels on a pair of through-body-vias at different voltage levels, and allowing the charges on the through-body-vias to redistribute between them to a third, common voltage level. As explained in greater detail below, such a test may be utilized in determining whether one or more of the through-body-vias of the pair has a defect such as an open condition, for example, as a function of the level of the third, common voltage. Although the illustrated embodiment depicts sharing charges between a pair of input/output circuits, each of which includes a single through-body-via, it is appreciated that a charge sharing testing procedure in accordance with the present description may be applied to share charges among more than two circuit features having through-body-vias at a time, depending upon the particular application.

In the illustrated embodiment of FIGS. 1-3, each die 120, 120a, 120b, 120c has one or more on-board testing circuits 123 (FIG. 1) which perform parallel capacitance testing of through-body-vias for defects. In the example of the die 120, a conductor 130 (FIGS. 1, 2) on the front side 122a of each die connects such a through-body-via testing circuit 123 to a vertical front side connector such as the conductor 128, to the through-body-via 112 to test the through-body-via 112 and its associated conductors 128, 130, 162 and conductor contact pads 127, 160.

A complex integrated circuit such as a microprocessor, or memory, for example, may have hundreds of circuits (or more) to be individually tested. Accordingly, testing of dies is often automated.

Figure 4:
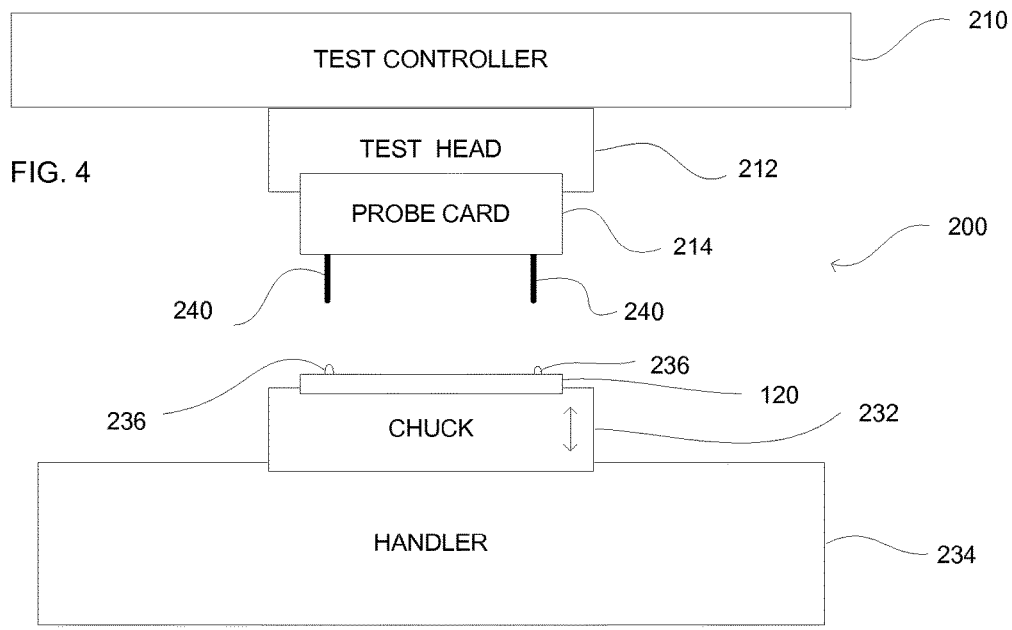
FIG. 4 schematically illustrates a testing apparatus for testing dies in accordance with one embodiment of the present description.

FIG. 4 depicts one example of an automated testing apparatus 200 in accordance with one embodiment of the present description. Other testing apparatus may be used, depending upon the particular application. The testing apparatus 200 includes a test controller or tester 210, and a test head 212. A probe card 214 may be secured by the test head 212 which electrically couples the test controller 210 to the probe card 214. A die to be tested such as the die 120 is secured by a chuck 232 of a handler 234. The die may be part of a wafer or may have already been cut from the wafer. During testing, the handler 234 under the control of the test controller 210, positions the die so as to precisely align the die bumps, bond pads or other electrical contact features 236 of the die 120 with corresponding mechanical probes 240 of the probe card 214. At the start of the test process, the handler 232 raises the die 120 so that selected electrical contact features 236 of the die 120 physically contact and make electrical connection with corresponding mechanical probes 240 of the probe card as shown in FIG. 1.

In this embodiment, some of the mechanical probes 240 are used to supply power (e.g. voltage) and ground signals to the die 120. Thus, although two mechanical probes 240 are depicted in the schematic diagram of FIG. 4, an actual probe card may have hundreds of such mechanical probes for applying power and ground signals to a die 120 such as the die 120 shown in FIG. 5. Still further, many of the mechanical probes may be used to send test signals including test pattern data and test control and timing signals to one or more die bumps or other electrical features on the die 120. Also, many of the mechanical probes may be used to receive test signals including test result data from one or more die bumps or other electrical features on the die 120. Such test operational data may include Joint Test Action Group (JTAG) signals, reset signals and clock signals, for example.

Figure 5:
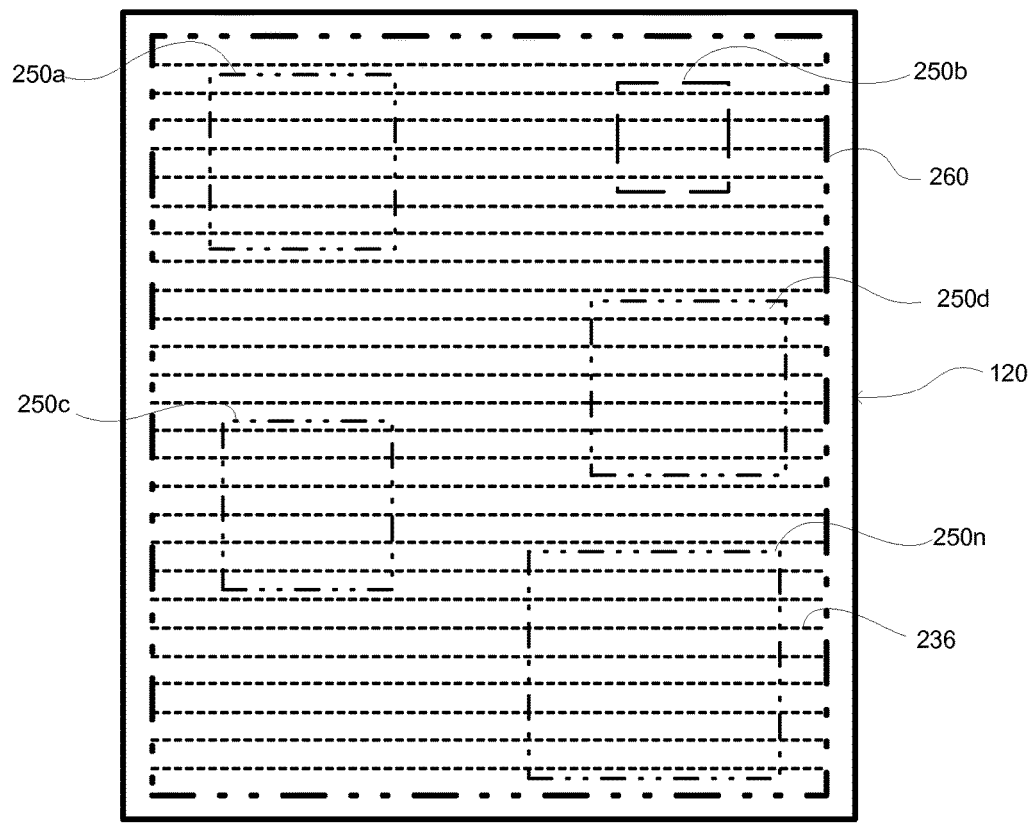
FIG. 5 is a schematic illustration of the front side of one embodiment of a die having a through-body-via testing circuit in accordance with the present description.

In the embodiment of FIG. 5, the die 120 has a number of separate circuit portions 250a, 250b . . . 250n which may include on-board testing circuits 123 and through-body-vias 112 to be tested, where n may be in the tens, hundreds or more, in an active region 260. Accordingly, the die 120 may have hundreds of electrical contact features 236 such as die bumps to receive power, ground and test signals from the probes 240 of the probe card 214. Also, the die 120 may have many electrical contact features 236 such as die bumps to transmit test data signals to the probes 240 of the probe card 214. However, dies to be tested in other applications may have a greater or fewer number of electrical contact features, depending upon the particular application.

A through-body-via testing circuit 123 may be used to test one or more separate circuit portions 250a, 250b . . . 250n and their associated through-body-vias to be tested. Thus, one or more separate circuit portions 250a, 250b . . . 250n may share a through-body-via testing circuit 123. Thus, a die 120 may have one through-body-via testing circuit 123 or may have many through-body-via testing circuits 123 for testing the through-body-vias of the separate circuit portions 250a, 250b . . . 250n, depending upon the particular application. However, it is appreciated that a capacitance testing circuit in accordance with the present description may be used to test circuit devices and structures, other than through-body-vias, depending upon the particular application.

In the illustrated embodiment, the through-body-via testing circuit 123 (FIG. 1) may include circuit portions such as I/O buffers which are used in normal operations of the circuitry of the die. The through-body-via testing circuit 123 (FIG. 1) may also include circuit portions which are used primarily to test the through-body-vias of the die 120 during one or more portions of the manufacturing process, such as during wafer sort testing, for example. Accordingly, a portion of through-body-via testing circuit 123 may not be intended to be used during normal operation of the die. Thus, if the die 120 is a memory die, for example, once the die 120 has been tested, attached to one or more other dies, and packaged, a portion of the testing circuit 123 may be covered by packaging and may not be operated again either by the manufacturer or by the consumer when using the die 120 to perform the memory function. It is appreciated however that in some applications, the entire through-body-via testing circuit 123 may be used in normal (non-testing) operations of the die 120.

Figure 6:
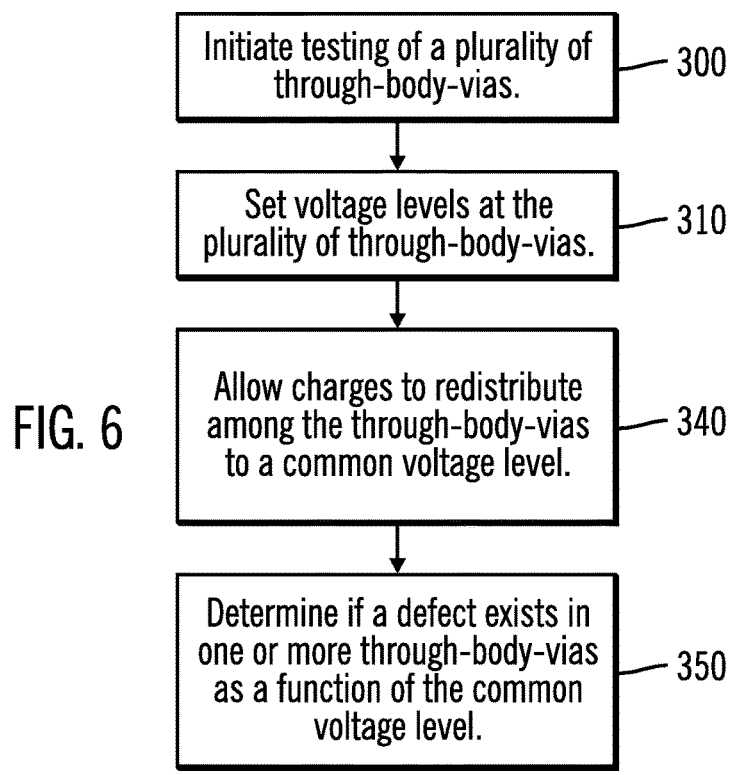
FIG. 6 illustrates operations in accordance with one embodiment for testing through-body-vias of a die in accordance with the present description.

FIG. 6 illustrates one embodiment of operations for testing through-body-vias of a die using a capacitance testing circuit. In one operation, testing of a plurality of through-body-vias is initiated (block 300). In the illustrated embodiment, the testing includes capacitance testing through-body-vias in parallel for a defect as a function of the capacitances of the through-body-vias. The testing may be initiated by providing suitable test signals to the through-body-vias testing circuit 123 through a mechanical probe as depicted in FIG. 4. However, it is appreciated that testing may be initiated using other techniques such as providing suitable test signals to the through-body-via testing circuit 123 through an external pin received in a test socket, for example. Other examples include internally providing test signals to the through-body-via testing circuit 123 to initiate testing in a self test. Other techniques may be used to initiate testing, depending upon the particular application.

Figure 7:
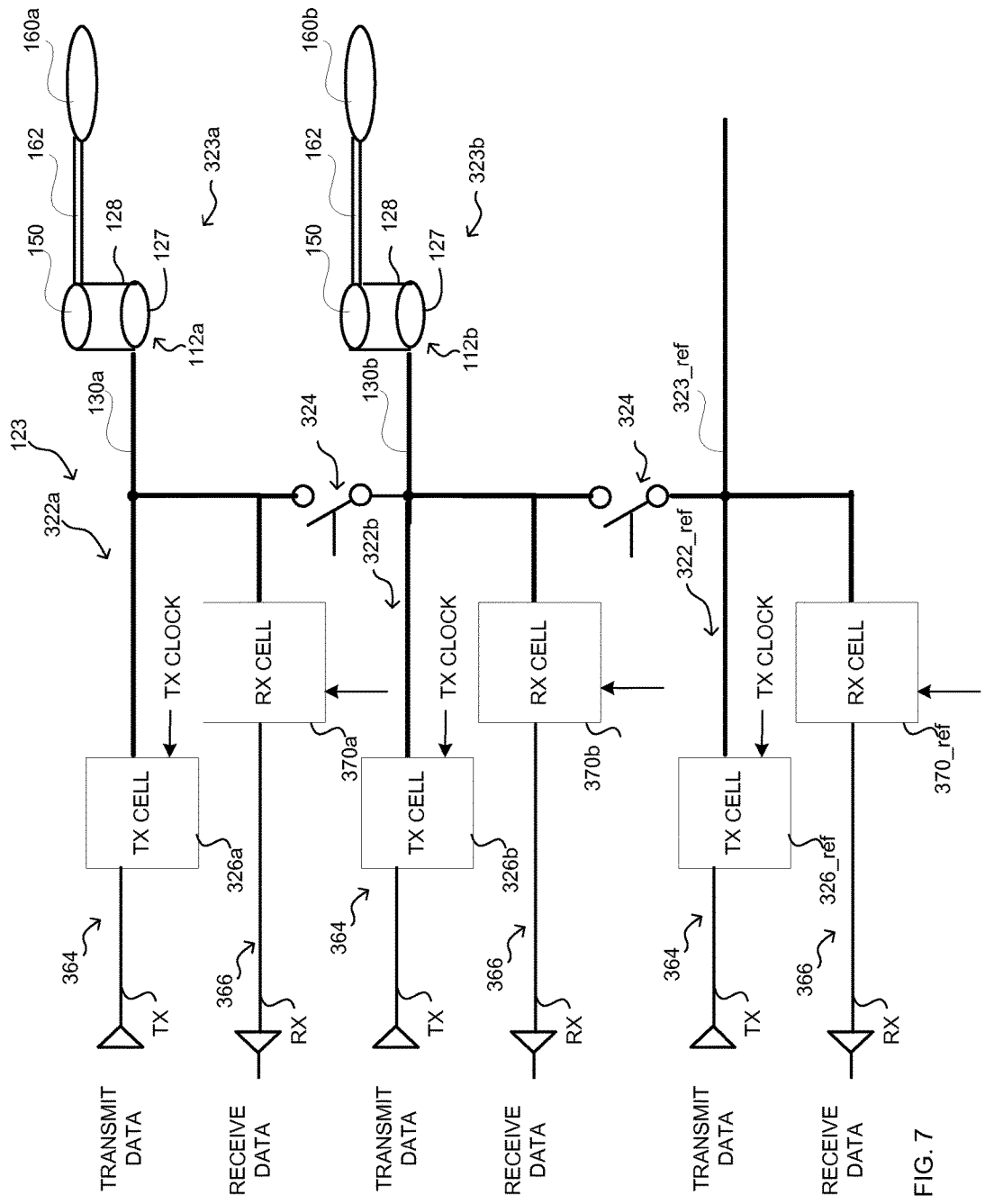
FIG. 7 illustrates one example of a through-body-via testing circuit in accordance with the present description, which includes I/O buffers coupled to through-body-vias.

Upon initiation of testing, in a charge sharing process, voltage levels on a pair of through-body-vias are set (block 310, FIG. 6) at different voltage levels. FIG. 7 depicts an example of a pair of through-body-vias 112a, 112b, each of which is coupled to a respective I/O buffer 322a, 322b of the testing circuit 123. In the illustrated embodiment, the I/O buffers 322a, 322b are used during normal operation of the circuitry of the die but also form a portion of the testing circuit 123. The back side contact pads 160a, 160b connected to the through-body-vias 112a, 112b, respectively, are the I/O pads of the I/O buffers 322a, 322b. Thus, the I/O buffer 322a has input/output conductors 323a which includes conductor 130a, through-body-via 112a and back side contact pad 160a. Similarly, the I/O buffer 322b has input/output conductors 323b which includes conductor 130b, through-body-via 112b and back side contact pad 160b.

In one aspect of the present description, it is recognized that the capacitance exhibited at a through-body-via such as the through-body-via 112a, is a function of the capacitance of the various input/output conductors 323a including the conductor 130a, the through-body-via 112a and the back side input/output contact pad 160a. The total capacitance exhibited at the input/output conductors 323a is represented by the capacitor $C_{pad\_a}$ depicted in FIG. 8a. Similarly, the total capacitance exhibited at the input/output conductors 323b including the conductor 130b, the through-body-via 112b and back side input/output contact pad 160b, is represented by the capacitor $C_{pad\_b}$ depicted in FIG. 8a.

Figure 8A:
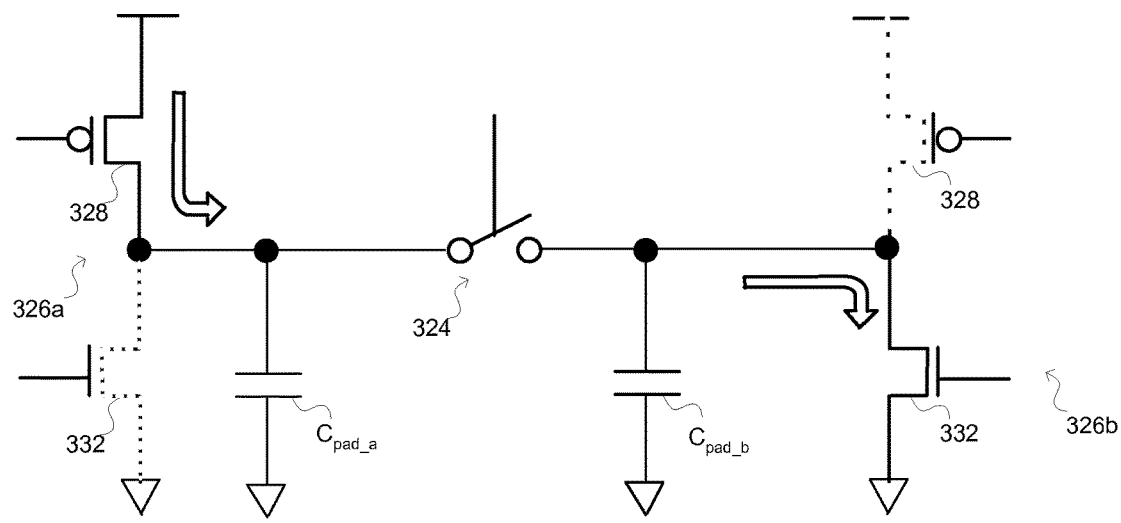
FIG. 8a is a schematic diagram illustrating an example of a setting voltage level operation for a pair of I/O pads of a pair of I/O buffers in accordance with an operation of FIG. 6.
Figure 9A:
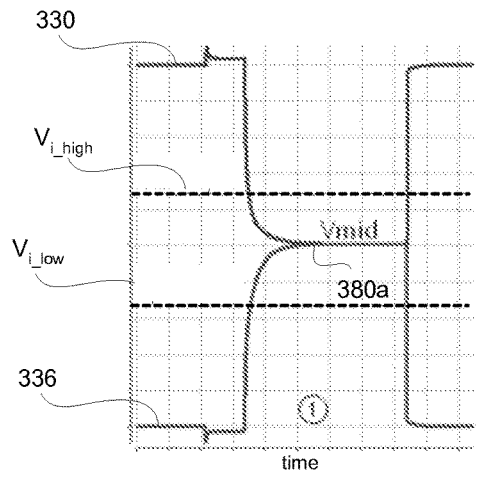
FIG. 9a-9c illustrate examples of results of charge redistribution operations for a pair of I/O pads of a pair of I/O buffers in accordance with an operation of FIG. 6.

To set the voltage levels on the input/output conductors 323a, 323b including the through-body-vias 112a, 112b, respectively, a switch 324 of the testing circuit 123 is opened as shown in FIGS. 7 and 8a. In addition, a logic "1" is applied to a transmitter cell 326a of the I/O buffer 322a, which turns on a transistor switch 328 (FIG. 8a) of the transmitter cell 326a, allowing current to flow to the capacitance load $C_{pad\_a}$ which includes the through-body-via 112a (FIG. 7). The transistor 332 of the cell 326a is in the off condition as represented by the dashed lines in FIG. 8a. As a result, the capacitance load $C_{pad\_a}$ including the through-body-via 112a is precharged to a first voltage level 330 representing a logic "1" value as shown in FIG. 9a. Conversely, a logic "0" is applied to a transmitter cell 326b of the I/O buffer 322b, which turns on a transistor switch 332 (FIG. 8a) of the transmitter cell 326b, allowing current to flow from the capacitance load $C_{pad\_b}$ which includes the through-body-via 112b (FIG. 7), through the transistor switch 332. The transistor 328 of the cell 326b is in the off condition as represented by the dashed lines in FIG. 8a. As a result, the capacitance load $C_{pad\_b}$ including the through-body-via 112b is discharged to a second, lower voltage level 336 representing a logic "0" state as shown in FIG. 9a. As used herein, the term "buffer" refers to an amplifier or other circuit to transfer a voltage.

Figure 8B:
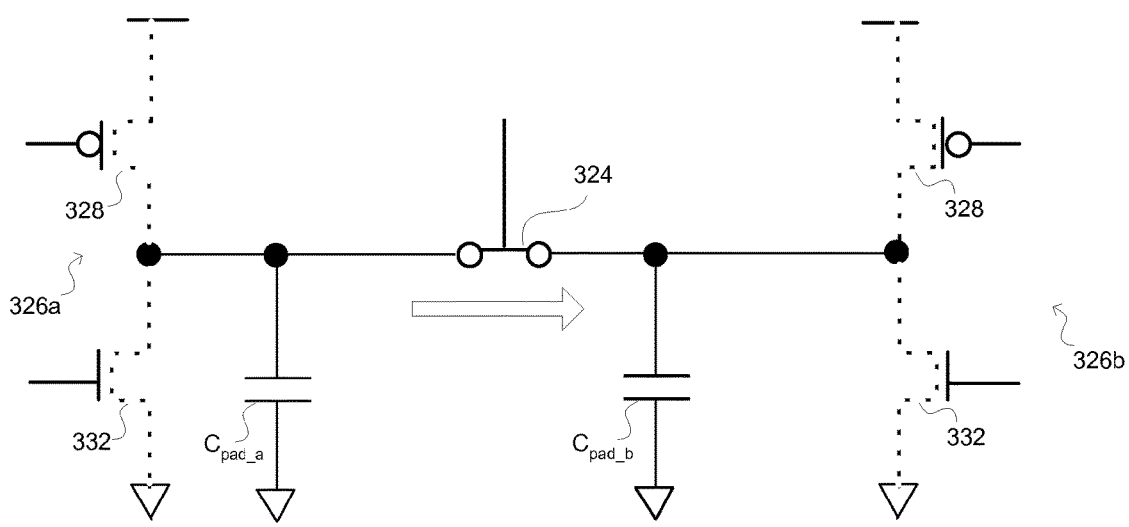
FIG. 8b is a schematic diagram illustrating an example of a charge redistribution operation for a pair of I/O pads of a pair of I/O buffers in accordance with an operation of FIG. 6.

After the voltage levels on the pair of through-body-vias 112a, 112b and associated conductors have been set (block 310, FIG. 6) at different voltage levels, the I/O buffers 322a, 322b may be placed in a high impedance state such that the transistors 328, 332 of the cell 326a and the transistors 328 and 332 of the cell 326b are in the off condition as represented by the dashed lines in FIG. 8b. In addition, the switch 324 may be closed as shown in FIG. 8b, electrically coupling the I/O pads 160a, 160b and their associated through-body-vias 112a, 112b together, allowing the charges on the capacitance loads $C_{pad\_a}$, $C_{pad\_b}$ to redistribute (block 340, FIG. 6) themselves between the capacitance loads $C_{pad\_a}$, $C_{pad\_b}$ to arrive at a third, common voltage level, which is between the first and second voltage levels 330, 336. In one aspect of the present description, it is recognized that the level of the common voltage resulting from the charge redistribution is a function of that ratio of the capacitance loads $C_{pad\_a}$, $C_{pad\_b}$. Thus, it is further recognized that the level of the common voltage provides an estimation of the relative capacitances of the through-body-vias 112a, 112b and hence may be utilized in determining as a function of the level of the common voltage, whether one or more of the through-body-vias 112a, 112b has a defect such as an open condition, for example. Thus, a determination is made (block 350) as a function of the common charge redistribution voltage, as to whether a defect exists in a one or both of the through-body-vias.

As set forth above, it is recognized that the total capacitance $C_{pad}$ at a circuit feature having a through-body-via such as the through-body-via 112, is a function of the capacitance of various conductors at that feature including the through-body-via 112. Thus, in the illustrated embodiment, the total capacitance $C_{pad}$ at the conductor 130 to the through-body-via 112 is a function of the capacitance $C_{tx}$, that is, the capacitance of the transmitter circuit 364, the capacitance $C_{rx}$, that is, the capacitance of the receiver circuit 366, the capacitance $C_{esd}$, that is, the capacitance of diodes (not shown) for electro static discharge (ESD) protection, the capacitance $C_{inte}$, that is, the capacitance of connectors such as the conductors 127, 128, 130 on the front side 122a of the die 120, the capacitance $C_{tsv}$, that is, the capacitance of the through-body-via 112, the capacitance $C_{rdl}$, that is, the capacitance of the redistribution layer conductors such as the conductor 162, and the capacitance $C_{upad}$, that is, the capacitance of the pad 160 on the back side 122b of the die 120. Thus, the total capacitance $C_{pad}$ at the conductor 130 to the through-body-via 112, may be represented as follow:

$$C_{pad} = C_{tx} + C_{rx} + C_{esd} + C_{inte} + C_{tsv} + C_{rdl} + C_{upad}$$

These contributions can be grouped into two components:

$$C_{pad} = C_{i/o} + C_{tsv\_tot}$$

where $C_{i/o} = C_{tx} + C_{rx} + C_{esd} + C_{inte}$, and $C_{tsv\_tot} = C_{tsv} + C_{rdl} + C_{upad}$.

It is recognized herein that the capacitance $C_{i/o}$ represents those capacitive components which are typically substantially independent of defects that may be caused by defects of the processing which forms the through-body-via itself or the back side layers. Thus, it is recognized herein that the capacitive components of the capacitance of the transmitter circuit 364 ($C_{tx}$), the capacitance of the receiver circuit 366 ($C_{rx}$), the capacitance $C_{esd}$, that is, the capacitance of diodes ($C_{esd}$) for electro-static discharge protection, and the capacitance of connectors such as the conductors 127, 128, 130 ($C_{inte}$), on the front side 122a of the die 120, are typically substantially independent of defects that may be caused by defects of the processing which forms the through-body-via itself.

It is further recognized that the existence and proper operability of those components which contribute to the capacitance $C_{i/o}$ may be confirmed using known testing techniques. Thus, the existence and operability of an I/O buffer and its receiver circuit 366 and its transmitter circuit 364 may be confirmed using known testing techniques. Similarly, existence and operability of the conductors 127, 128, 130 ($C_{inte}$), on the front side 122a of the die 120 may be confirmed using known testing techniques.

Conversely the capacitance $C_{tsv\_tot}$ represents the capacitances of those components which are more likely to be affected by defects caused by the processing which forms the through-body-via 112 as well as the redistribution layer and contact pad on the back side 122b of the die. Thus, the capacitive components of the capacitance $C_{tsv}$ of the through-body-via 112, the capacitance $C_{rdl}$ of the redistribution layer connector 162, and the capacitance $C_{upad}$ of the connector pad 160, are believed to be more likely to be affected by defects caused by the processing which forms the through-body-via 112 as well as the redistribution layer and contact pad on the back side 122b of the die.

Accordingly, an indication of a defect in those components contributing capacitance to the capacitance $C_{tsv\_tot}$ may be obtained by obtaining a measurement of the capacitance $C_{tsv\_tot}$ associated with conductors including a through-body-via such as a through-silicon-via. In the illustrated embodiment, the through-body-vias 112a, 112b and their associated I/O buffers 322a, 322b are neighboring components of the same design. Hence, those components contributing to the total capacitance $C_{pad\_a}$ (at the conductor 130a to the through-body-via 112a) and the total capacitance $C_{pad\_b}$ (at the conductor 130b to the through-body-via 112b) may be modeled in a substantially similar manner. Hence, the total capacitance $C_{pad\_a}$ exhibited at the conductor 130a to the through-body-via 112a, and the total capacitance $C_{pad\_b}$ exhibited at the conductor 130b to the through-body-via 112b, may like the total capacitance $C_{pad}$ exhibited at the conductor 130 to the through-body-via 112, be represented in the same manner:

$$C_{pad\_a} = C_{i/o\_a} + C_{tsv\_tot\_a}$$

$$C_{pad\_b} = C_{i/o\_b} + C_{tsv\_tot\_b}$$

Figure 9B:
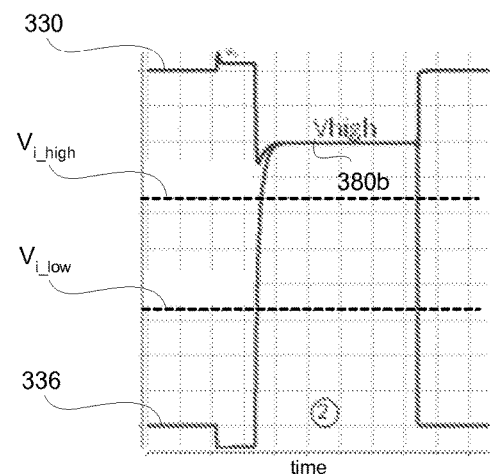
Figure 9C:
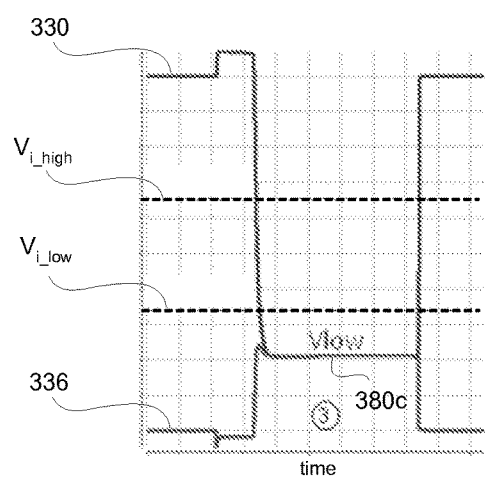

As previously mentioned, it is recognized that the level of the common voltage resulting from the charge redistribution is a function of the ratio of the capacitance loads $C_{pad\_a}$, $C_{pad\_b}$. FIG. 10 depicts the common voltage designated as $V_{pad}$ expressed as a function of the ratio of the capacitance loads $C_{pad\_a}$, $C_{pad\_b}$ where $C_{pad\_a} = C_{i/o\_a} + C_{tsv\_tot\_a}$ and $C_{pad\_b} = C_{i/o\_b} + C_{tsv\_tot\_b}$. A receiver of the I/O buffer may be used to detect the level of the common voltage as $V_{pad}$. For example, a receiver cell 370a, 370b of the receivers 366 of the I/O buffers 322a, 322b, includes a comparator circuit which may be used to detect a logic state of the common voltage $V_{pad}$. In the illustrated embodiment, a logic "1" output of the receiver cell 370a, 370b changes logic state to a logic "0" as the input voltage to the cell 370a, 370b transitions from a high voltage to a lower voltage which is lower than a threshold level $V_{i\_low}$ (FIGS. 9a-9c). Conversely, a logic "0" output of the receiver cell 370a, 370b changes logic state to a logic "1" as the input voltage to the cell 370a, 370b transitions from a low voltage to a higher voltage which is higher than a threshold level $V_{i\_high}$ (FIGS. 9a-9c). In the illustrated embodiment, the threshold voltage $V_{i\_high}$ is higher than the threshold voltage $V_{i\_low}$ such that the cell 370a, 370b exhibits a hysteresis. It is appreciated that other types of detector or comparator cells may be utilized, depending upon the particular application.

In the illustrated embodiment, an open condition in the through-body-via itself or in the associated conductors to the I/O pad is referred to collectively herein as an "open TSV" which results in a relatively small capacitance at the I/O pad. Conversely, a proper connectivity within the through-body-via itself and in the associated conductors to the I/O pad is referred to collectively as a "good TSV" which results in a relatively large capacitance at the associated I/O pad.

Figures 11, 15:
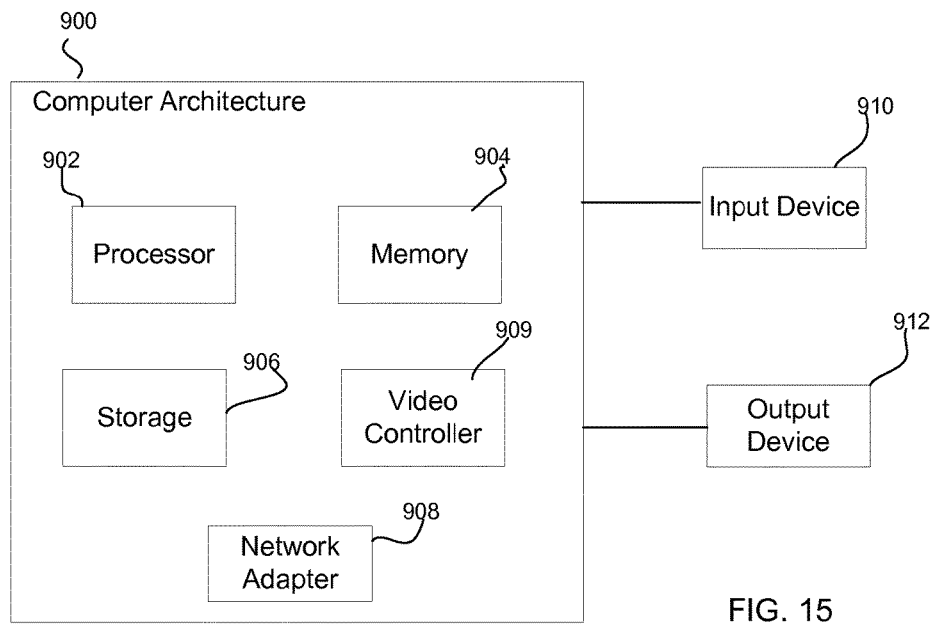
FIG. 11 is a table representing various scenarios of the results of charge redistribution operations as a function of the resultant logic states of receivers of the I/O buffers of FIG. 7.
FIG. 15 illustrates an embodiment of a system utilizing a die having a through-body-via testing circuit in accordance with one embodiment of the present description.

In setting (block 310, FIG. 6) the voltages levels for the through-body-vias 112a and 112b and their associated conductors, possible good TSV or open TSV scenarios may be grouped into four classes of scenarios at the voltage setting (block 310, FIG. 6) stage of testing following through-silicon-via and backside connector processing, as shown in the table of FIG. 11. The four scenarios of good/bad TSV for two I/O pads 160a, 160b scenarios at the voltage setting (block 310, FIG. 6) stage are: (1) both I/O pads 160a, 160b have good TSVs (that is, no open conditions in the associated through-body-via or associated conductors of each pad); (2) both pads 160a, 160b have open TSVs (that is, the associated through-body-via or associated conductors of both pads have an open condition) (3) one pad 160a having a good TSV is pre-charged to "1" (block 310, FIG. 6) while the other pad 160b having open TSV is discharged to "0"; and (4) one pad 160a having open TSV is pre-charged to "1" (block 310, FIG. 6) while the other pad 160b having good TSV is discharged to "0". The rows designated "TX" in the table of FIG. 11 indicate that logic states to which the pads 160a, 160b are driven by the transmitter cells 326a, 326b in the voltage setting (block 310, FIG. 6) stage of the charge sharing test.

Following the voltage level setting stage (block 310, FIG. 6), in which the pads 160a, 160b for the through-body-vias 112a, 112b are set at logic "1" and logic "0" values, respectively, as indicated by the TX rows of the table of FIG. 11, and following the charge redistribution stage (block 340, FIG. 6), the receiver cells 370a, 370b detect the resultant voltage levels of the pads 160a, 160b for the through-body-vias 112a, 112b. The resultant logic states of the receiver cells 370a, 370b are indicated in the rows designated "RX" in the table of FIG. 11.

The possible outcomes of the charge redistribution stage (block 340, FIG. 6) based on the four scenarios of the table of FIG. 11, may be grouped into three sets of outcomes as depicted in FIGS. 9a-9c, respectively. In one charge redistribution outcome depicted in FIG. 9a, both I/O pads 160a, 160b have good TSVs, or both I/O pads 160a, 160b have open TSVs such that $C_{pad\_a}$ is substantially equal to $C_{pad\_b}$. As a result, after closing the switch 324, the charges of the precharge voltage level 330 and the discharge voltage level 336 will redistribute into substantially the same capacitances $C_{pad\_a}$, $C_{pad\_b}$ resulting in a final common voltage Vmid at 380a. As shown in FIG. 9a, the common voltage Vmid is higher than the low threshold $V_{i\_low}$ such that the voltage at the input of the receiver cell 370a for the through-silicon-via 112a and I/O pad 160a, falling from the logic "1" value 330, does not cross the low threshold $V_{i\_low}$ and the output of the receiver cell 370a remains at the logic "1" state as shown in the corresponding RX rows of the table of FIG. 11 for scenarios (1) and (2). Conversely, the common voltage Vmid is lower than the high threshold $V_{i\_high}$ such that the voltage at the input of the receiver cell 370b for the through-silicon-via 112b and I/O pad 160b, rising from the logic "0" value 336, does not cross the high threshold $V_{i\_high}$ and the output of the receiver cell 370b remains at the logic "0" value as shown in the corresponding RX rows of the table of FIG. 11 for scenarios (1) and (2). Accordingly, there are no changes at the RX output of the receivers 370a, 370b for scenarios (1) and (2).

In another charge redistribution outcome depicted in FIG. 9b, the I/O pad 160a having the good TSV (and resultant relatively large $C_{pad\_a}$) is pre-charged to a logic "1" state and the I/O pad 160b with an open TSV (and resultant relatively small $C_{pad\_b}$) is discharged to the logic "0" state at the voltage setting stage (block 310, FIG. 6). Following closing the switch 324 and the resultant charge redistribution (block 350), the larger capacitance $C_{pad\_a}$ is discharging into the smaller one $C_{pad\_b}$ resulting in a final common voltage Vhigh at 380b. As shown in FIG. 9b, the common voltage Vhigh is higher than the low threshold $V_{i\_low}$ such that the voltage at the input of the receiver cell 370a for the through-silicon-via 112a and I/O pad 160a, falling from the logic "1" value 330, does not cross the low threshold $V_{i\_low}$ and the output of the receiver cell 370a remains at the logic "1" value as shown in the corresponding RX row in the table of FIG. 11 for scenario (3). Conversely, the common voltage Vhigh is higher than the high threshold $V_{i\_high}$ such that the voltage at the input of the receiver cell 370b for the through-silicon-via 112b and I/O pad 160b, rising from the logic "0" value 336, does cross the high threshold $V_{i\_high}$ and the output of the receiver cell 370b changes to the logic "1" value as shown in the corresponding RX row in the table of FIG. 11 for scenario (3).

In the third charge redistribution outcome depicted in FIG. 9c, the I/O pad 160a having the open TSV (and resultant relatively small $C_{pad\_a}$) is pre-charged to a logic "1" state and the I/O pad 160b with a good TSV (and resultant relatively large $C_{pad\_b}$) is discharged to the logic "0" state at the voltage setting stage (block 310, FIG. 6). Following closing the switch 324 and the resultant charge redistribution (block 350), the smaller capacitance $C_{pad\_a}$ is discharging into the larger capacitance $C_{pad\_b}$ resulting in a final common voltage Vlow at 380c. As shown in FIG. 9c, the common voltage Vlow is lower than the low threshold $V_{i\_low}$ such that the voltage at the input of the receiver cell 370a for the through-silicon-via 112a and I/O pad 160a, falling from the logic "1" value 330, does cross the low threshold $V_{i\_low}$ and the output of the cell 370a changes to the logic "0" state as shown in the corresponding RX row in the table of FIG. 11 for scenario (4). Conversely, the common voltage Vlow is lower than the high threshold $V_{i\_high}$ such that the voltage at the input of the receiver cell 370b for the through-silicon-via 112b and I/O pad 160b, rising from the logic "0" value 336, does not cross the high threshold $V_{i\_high}$ and the output of the receiver cell 370b remains at the logic "0" value as shown in the corresponding RX row in the table of FIG. 11 for scenario (4).

Thus, following execution of a single charge sharing test for I/O pads 160a, 160b and their associated through-body-vias 112a, 112b, if neither receiver cell 370a, 370b changes output during the test, it may be concluded from the table of FIG. 11, that both I/O pads have approximately the same capacitance (within the random variation range) and condition of the I/O pads 160a, 160b and their associated through-body-vias 112a, 112b is determined to be one of scenario (1), that is, both I/O pads have good TSVs, or scenario (2), that is, both I/O pads have open TSVs. However, if only one of the receiver cells 370a, 370b changes its output, the I/O pad associated with the changing receiver cell has an open TSV. Thus, if only receiver cell 370a for I/O pad 160a changes its output (scenario (3)), the I/O pad 160a is deemed to have an open TSV. Conversely, if only receiver cell 370b for I/O pad 160b changes its output (scenario (4)), the I/O pad 160b is deemed to have an open TSV. Should the logic state of both receiver cells 370a, 370b change state, it is deemed to be an illegal test outcome in this embodiment.

It is seen from the table of FIG. 11 and FIG. 9a that both scenario (1), that is, both I/O pads have good TSVs, and scenario (2), that is, both I/O pads have open TSVs, produce the same test results after execution of a single charge sharing test. In accordance with another aspect of the present description, to differentiate between these two cases, a known capacitive reference may be introduced for comparison purposes. In the illustrated embodiment, a replica I/O buffer 322_ref (FIG. 7) having a transmitter 364 and a receiver 366 is added to the I/O interface and connected with a charge sharing switch 324 to one or more its neighbor buffers 322a, 322b. In this embodiment, the replica buffer 322_ref is not connected to a through-body-via or to an actual I/O pad and thus, it provides a known capacitive reference corresponding to an I/O buffer with a "TSV open" condition at a node 323_ref.

Figure 12A:
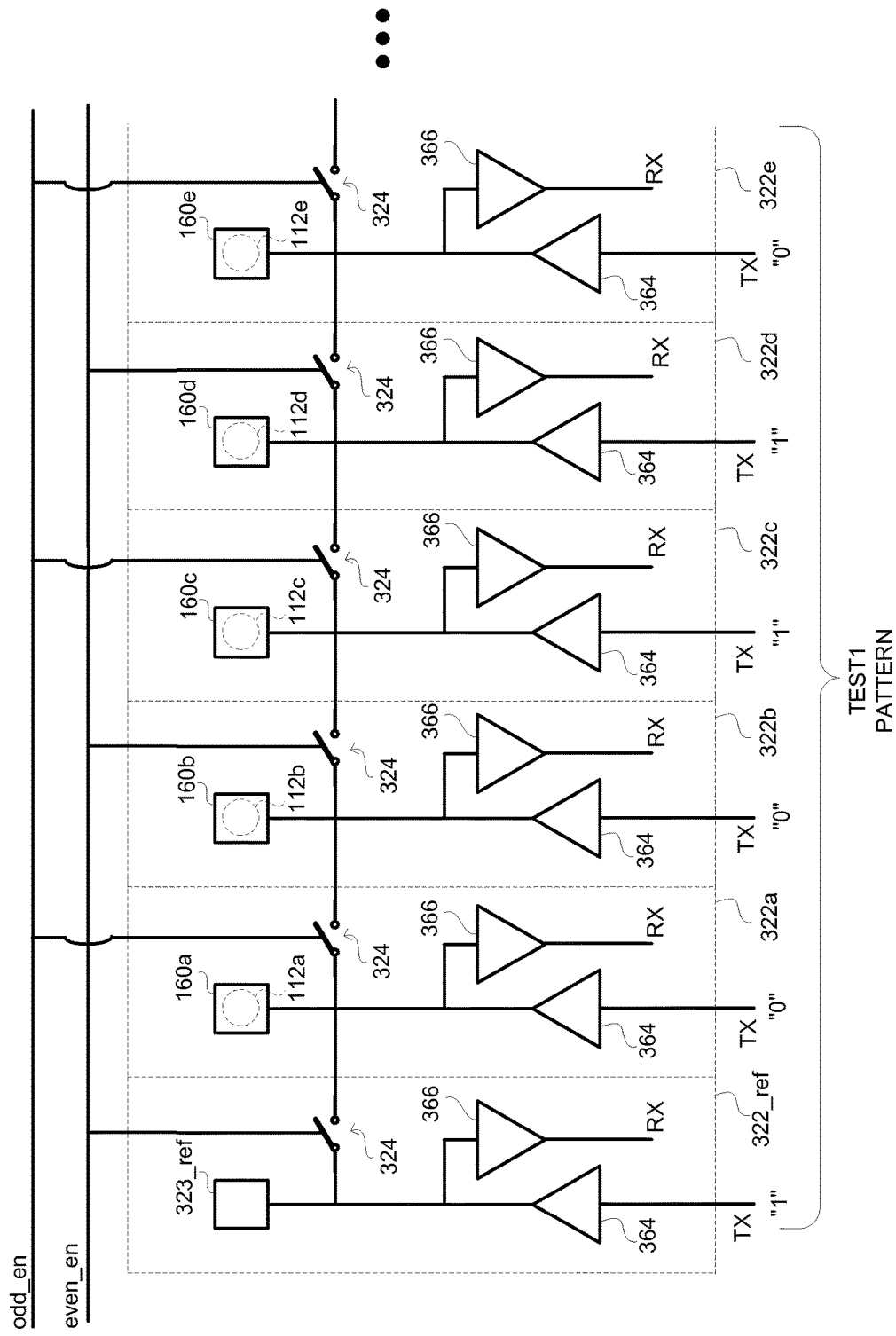
FIGS. 12a and 12b illustrate examples of test patterns being applied to transmitter circuits of I/O buffers having a through-body-via testing circuit in accordance with one embodiment of the present description.

FIG. 12a shows an example of an I/O interface having tens, hundreds or more I/O buffers 322a, 322b . . . 322n and one replica buffer 322_ref which is sufficient for a channel containing the I/O buffers 322a, 322b . . . 322n. Since the transmitter 364 and the receiver 366 of the replica buffer 322_ref may be substantially identical to the transmitter 364 and the receiver 366 of each of the other I/O buffers 322a, 322b . . . 322n in the interface, its capacitance $C_{i/o}$ ($C_{i/o}=C_{tx}+C_{rx}+C_{esd}+C_{inte}$) at the node 323_ref may track the corresponding capacitance $C_{i/o}$ of other I/O buffers across formation process variations. It is anticipated that differences arising from random pad to pad variation may be minimal.

In the embodiment of FIG. 12a, the replica buffer 322_ref is positioned at the left end of the chain of I/O buffers 322a, 322b . . . 322n. However, it is appreciated that the position of the replica I/O buffer 322_ref within the chain of buffers may be arbitrary. Accordingly, it is believed that the replica I/O buffer 322_ref may be positioned at a point in the interior of the chain or at either end of it.

Figure 12B:
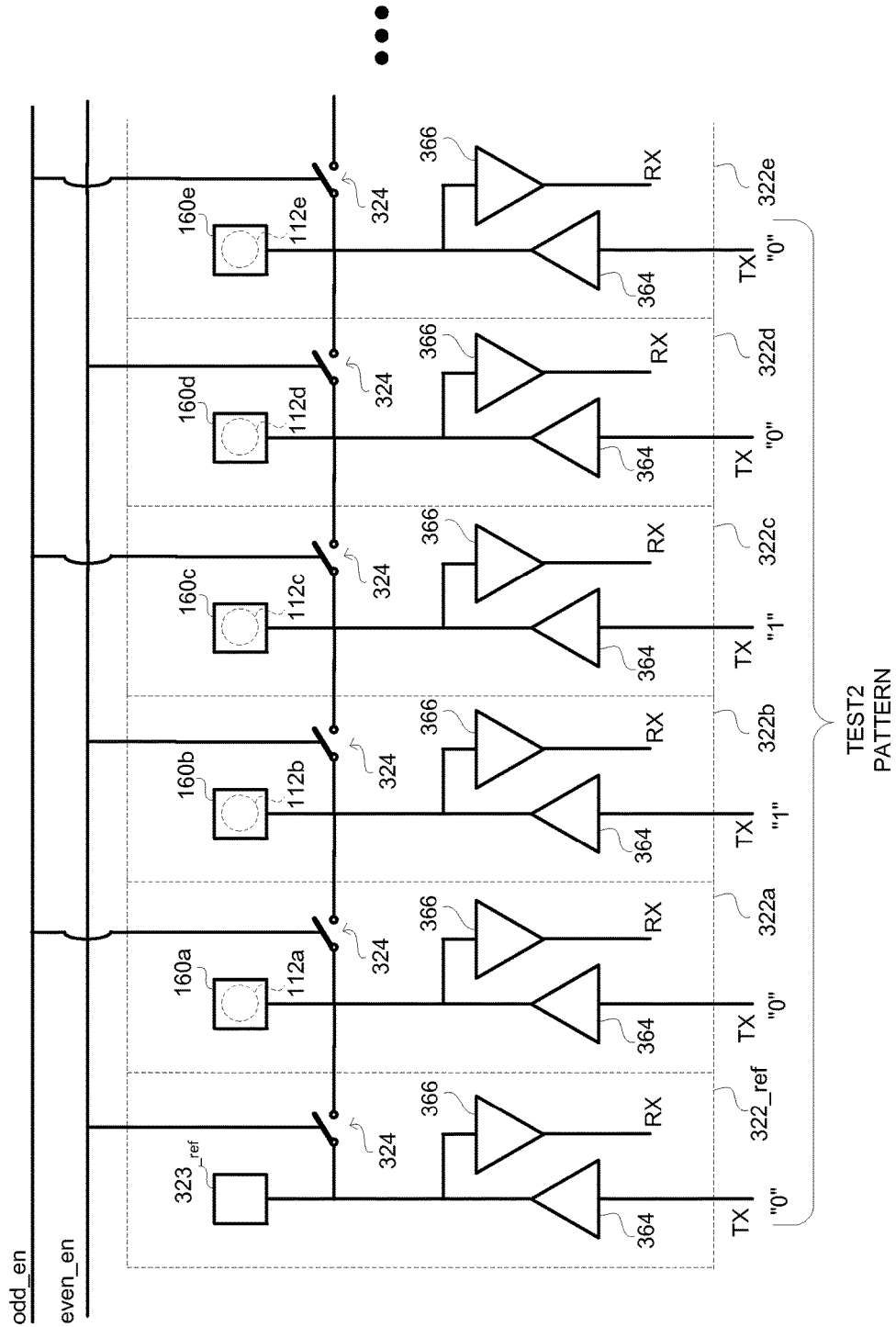

In one aspect of the present description, the charge sharing test may be executed twice following a manufacturing process in which the through-body-vias are formed. In this embodiment, the two executions of the charge sharing test differ in the particular data patterns placed in parallel at the TX inputs of the I/O transmitters 364 of each of the I/O buffers 322_ref, 322a, 322b . . . 322n. In addition, the configuration of charge sharing pass switches 324 in the two executions of the charge sharing test may differ. In the illustrated embodiment, the charge sharing pass switches 324 of one set of pairs of I/O buffers are enabled or disabled in parallel by a signal "even_en". The I/O buffers 322_ref, 322a, 322b . . . 322n may then be rearranged into a second set of pairs of I/O buffers by the charge sharing pass switches 324 in which the charge sharing pass switches 324 of the second set of pairs of I/O buffers are enabled or disabled in parallel by a signal "odd_en. As shown in FIGS. 12a, 12b, the charge sharing pass switches 324 are alternately driven by the signals "even_en" and "odd_en" As a result, each interior I/O buffer is arranged in a pair with the neighboring I/O buffer on one side, in which the pair is coupled and uncoupled by the signal "even_en." Similarly, each interior I/O buffer may be rearranged in a pair with the neighboring I/O buffer on the other side, in which that other pair is coupled and uncoupled by the signal "odd_en." In this manner, each I/O buffer of the first set of pairs of I/O buffers, is paired with a different I/O buffer in the second set of pairs of I/O buffers. The first set of pairs of I/O buffers is enabled by the "even_en" signal and the second set of pairs of I/O buffers is enabled by the "odd_en" signal.

In the illustrated embodiment, test patterns are provided which facilitate pre-charging and charge redistribution through enabled charge sharing pass switches 324. In addition, the test patterns are selected to reduce or minimize leakage through disabled pass switches 324. Thus, for example, both sides of a disabled pass gate may be driven by the test pattern to the same state during the voltage setting stage (block 310, FIG. 6).

Figure 13:
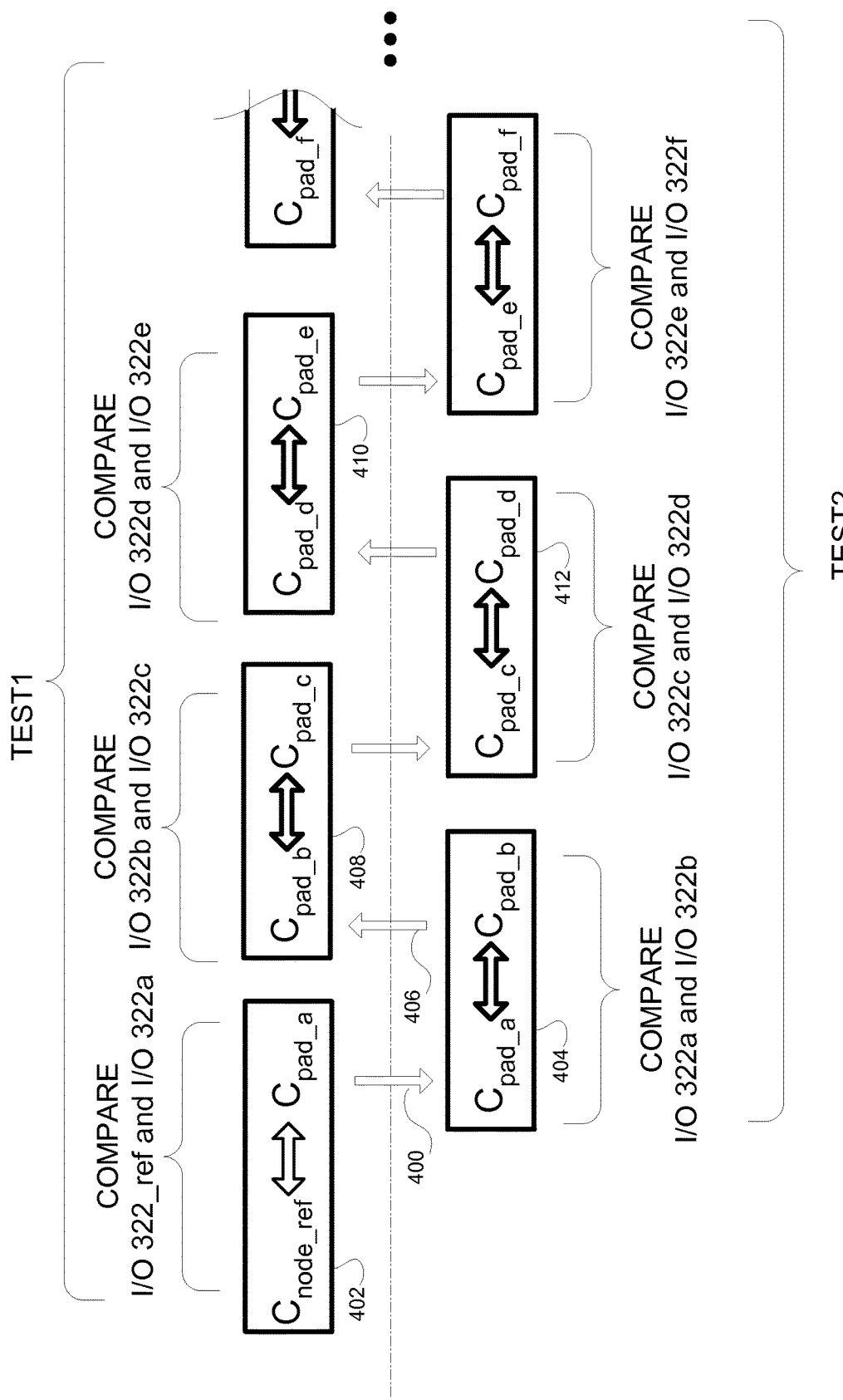
FIG. 13 illustrates propagation of results data for comparisons of I/O buffers of FIGS. 12a, 12b.

For example, in a first test, designated "TEST1", a first test pattern "10 01 10 01 10 01 . . . " may be applied to the parallel TX inputs of the transmitters 364 of the I/O buffers 322_ref, 322a, 322b . . . as shown in FIG. 12a during a voltage setting stage (block 310, FIG. 6) with all the charge sharing pass switches 324 disabled (even_en deasserted, odd_en deasserted) driving the voltage levels on the I/O node 323_ref and the I/O pads 160a, 160b . . . to the logic states of the applied test pattern "10 01 10 01 10 01 . . . . "
In a subsequent charge redistribution phase (block 340, FIG. 6) of TEST1, all I/O buffers 322_ref, 322a, 322b . . . are placed in a high impedance state (HiZ) state, and the group of charge sharing pass switches 324 driven by the signal "even_en" are enabled in parallel (while the signal "odd_en" remains deasserted), allowing charge redistribution to occur in parallel between I/O buffer pairs of a first set of I/O buffer pairs: I/O buffers 322_ref and 322a (capacitance comparison 402, FIG. 13); I/O buffers 322b and 322c (capacitance comparison 408, FIG. 13); I/O buffers 322d and 322e (capacitance comparison 410, FIG. 13); etc as shown in FIGS. 12a and 13.

After completion of the charge redistribution, the output RX of each receiver 366 of each of the I/O buffers output 322_ref, 322a, 322b . . . is observed and stored in parallel as the results of TEST1. For example, the RX outputs may be captured in parallel and serially output through a test access port (TAP) test port.

In a second charge sharing test, designated TEST2, a second test pattern "0 01 10 01 10 01 10 01 . . . " may be applied in parallel to the TX inputs of the transmitters 364 of the I/O buffers 322_ref, 322a, 322b . . . as shown in FIG. 12b during another voltage setting stage (block 310, FIG. 6) with all the charge sharing pass switches 324 disabled (even_en deasserted, odd_en deasserted) driving the voltage levels on the I/O node 323_ref and the I/O pads 160a, 160b . . . to the logic states of the applied test pattern "0 01 10 01 10 01 10 01 . . . " in parallel. In a second, subsequent charge redistribution phase (block 340, FIG. 6), all I/O buffers 322_ref, 322a, 322b . . . are placed in a high impedance state (HiZ) state, and the group of charge sharing pass switches 324 driven by the signal "odd_en" are enabled in parallel (while the signal "even_en remains deasserted), and allowing charge redistribution to occur in parallel between the I/O buffer pairs of a the second set of I/O buffer pairs: I/O buffers 322a and 322b (capacitance comparison 404, FIG. 13); I/O buffers 322c and 322d (capacitance comparison 412, FIG. 13); etc. as shown in FIG. 12b and the table of FIG. 13.

After completion of the charge redistribution (block 340, FIG. 6), the output RX of each receiver 366 of each of the I/O buffers output 322_ref, 322a, 322b . . . is observed and stored in parallel as the results of TEST2. For example, the RX outputs may again be captured in parallel and serially output through a TAP test port to the tester (FIG. 4).

In accordance with another aspect of the present description, the status of each through-body-via of each I/O buffer in the interface can be uniquely determined in an analysis starting from the reference I/O buffer I/O 322_ref, and comparing results of the two tests, TEST1 and TEST2. Starting from the left of the table of FIG. 13, the test TEST1 provides a result 400 of a capacitance comparison 402 between I/O buffer 322_ref and I/O buffer 322a on the basis of a comparison of their respective capacitances $C_{node\_ref}$ and $C_{pad\_a}$. If $C_{node\_ref}$ and $C_{pad\_a}$ are determined to be substantially equal (i.e. neither RX output changed state indicating either scenario (1) or scenario (2), FIG. 11), it may be inferred that the I/O pad 160a of I/O buffer 322a has an open TSV condition (i.e. scenario (2) since it is known that the I/O node 323_ref of the I/O buffer 322_ref has a known open TSV condition. Conversely, if $C_{node\_ref}$ is found to be substantially less than $C_{pad\_a}$ (i.e. the RX output of the I/O buffer 322_ref changed its output), it may be inferred that the I/O pad 160a of I/O buffer 322a has an good TSV condition (i.e. scenario (4), FIG. 11).

Once the open/good TSV status of the I/O pad 160a of I/O buffer 322a is known, this information represented by result 400 may be used in an analysis of a capacitance comparison 404 between I/O buffer 322a and I/O buffer 322b on the basis of a comparison of their respective capacitances $C_{pad\_a}$ and $C_{pad\_b}$ as performed in the test TEST2. If $C_{pad\_a}$ and $C_{pad\_b}$ are found to be substantially equal (i.e. neither RX output changed state indicating either scenario (1) or scenario (2), FIG. 11), it may be inferred that the open/good TSV status of I/O pad 160b of I/O buffer 322b is the same as the known open/good TSV status of the I/O pad 160a of I/O buffer 322a as represented by result 400. However, if $C_{pad\_a}$ is found to be substantially less than $C_{pad\_b}$ (i.e. the RX output of the I/O buffer 322a changed its output), it may be inferred that the I/O pad 160a of I/O buffer 322a has an open TSV condition and the I/O pad 160b of I/O buffer 322b has a good open TSV condition (i.e. scenario (4), FIG. 11). On the other hand, if $C_{pad\_a}$ is found to be substantially greater than $C_{pad\_b}$ (i.e. the RX output of the I/O buffer 322b changed its output), it may be inferred that the I/O pad 160a of I/O buffer 322a has a good TSV condition and the I/O pad 160b of I/O buffer 322b has an open TSV condition (i.e. scenario (3), FIG. 11).

The results may then be propagated through the interface until all the results are known. For example, once the open/good TSV status of the I/O pad 160b of I/O buffer 322b is known, this information represented by result 406 may be used in an analysis of a comparison 408 between I/O buffer 322b and I/O buffer 322c on the basis of a comparison of their respective capacitances $C_{pad\_b}$ and $C_{pad\_c}$ as performed in the test TEST1, and so on.

Figure 14:
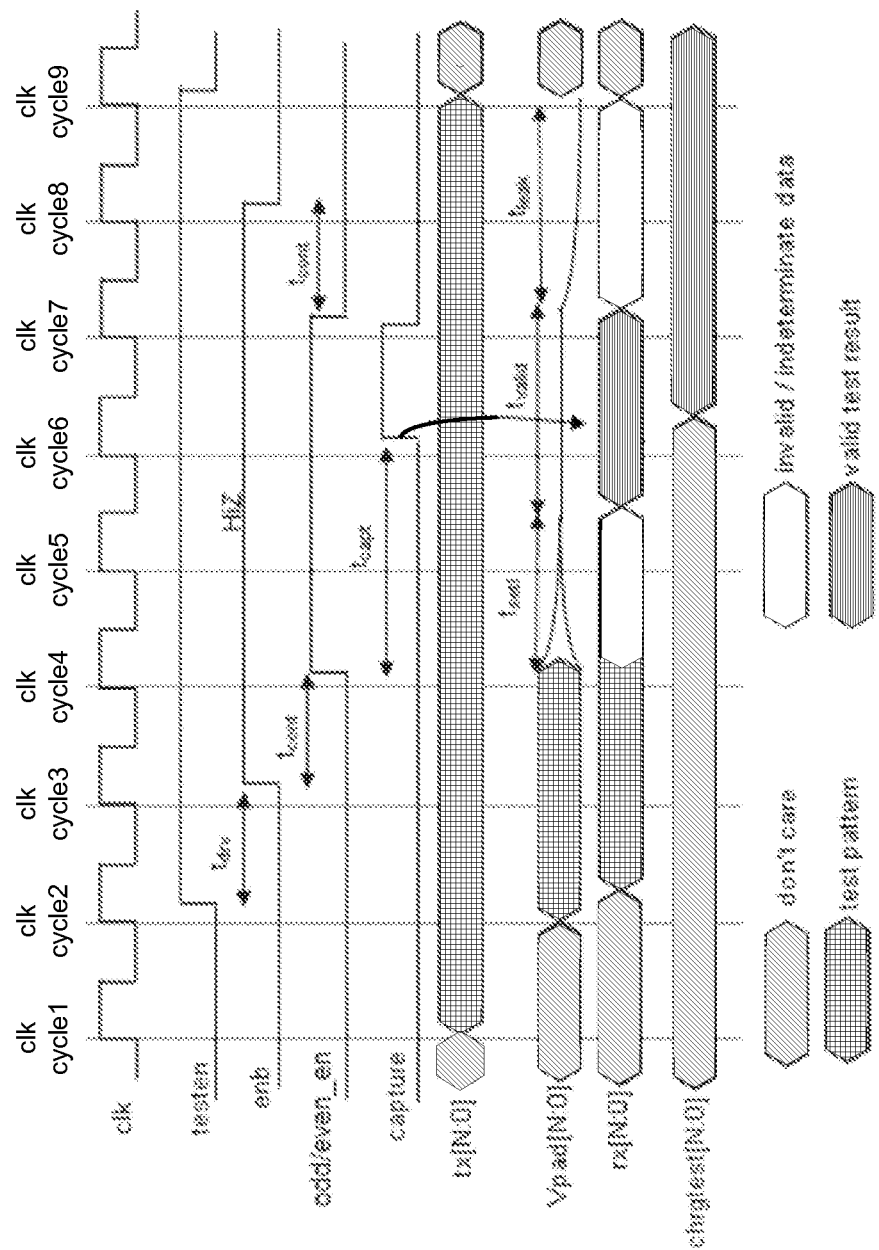
FIG. 14 illustrates one example of timing of through-body-via testing operations in accordance with the operations of FIG. 6.

FIG. 14 shows an example of a timing diagram of a single execution of a charge sharing test in accordance with the present description. It is appreciated that other timing may be utilized, depending upon the particular application. In this example, a test pattern such as the pattern of TEST1 of FIG. 12a or the test pattern of TEST2 of FIG. 12b, for example, is placed at the parallel TX inputs of each I/O buffer 322_ref, 322a, 322b . . . 322n as represented by the inputs tx[N:0] of FIG. 14 during a first clock cycle designated clk cycle1 before the start of the test.

The execution of the test starts with assertion of the signal "testen" in the next clock cycle, clk cycle2. In this manner the voltage levels of the pairs of I/O pads and their associated through-body-vias (or reference node) are set (block 310, FIG. 6) in accordance with the applied test pattern. After a suitable delay to allow the test pattern to drive the all the I/O buffers in parallel (wherein the delay is represented by the time interval $t_{drv}$), all transmitters 364 are placed in a high impedance state (HiZ) by deasserting the transmitter enable signal "enb" in the next clock cycle clk cycle3. In the illustrated embodiment, at least one clock cycle is provided for the I/O buffers to be actively driven in parallel by the applied test input pattern before the transmitters of the I/O buffers are placed in the high impedance state.

To start the charge redistribution phase (block 340, FIG. 6), the charge sharing pass switches 324 are enabled in parallel in the next cycle, clk cycle4, by asserting the charge sharing pass switch enable signal (odd_en for test pattern TEST1, or even_en for TEST2) after a suitable delay interval (designated $t_{cont}$) to reduce or eliminate any contention between the I/O pads. In the illustrated embodiment, at least one clock cycle is provided between the placing the I/O buffers in the high impedance state and the closing of the charge sharing pass switches 324.

After a suitable delay period (designated $t_{capt}$) to allow the voltages on the I/O pads to settle to the intermediate voltage $V_{pad}$ of each connected pairs of I/O buffers after redistribution pass gates are enabled, a capture signal "capture" is asserted in a subsequent clock cycle, e.g. clk cycle6, to capture the RX output of each I/O buffer in parallel into a suitable test register to store the results of the test in parallel. The stored results may be subsequently loaded to a tester such as the tester 210 of FIG. 4.

In the illustrated embodiment, sufficient settling time is provided in the interval $t_{capt}$ between the closing of the charge sharing pass switches 324 (odd/even_en asserted) and the subsequent capture of the RX outputs of the receivers of the I/O buffers. The test control circuit 123 generating the test control signals of FIG. 14 can be timed so as to ensure that the results of the test are sampled during the interval in which the results are valid as represented by the interval $t_{valid}$ shown in FIG. 14. Thus, if the receiver outputs RX of the I/O buffers are sampled while the I/O pad voltages are in the process of settling toward the intermediate voltage $V_{pad}$ during the interval $t_{set1}$, for example, an error might occur since the I/O pad voltages may not yet be stable. Conversely, if the receiver outputs RX of the I/O buffers are sampled too long after charge redistribution is allowed, such as during the interval $t_{leak}$, for example, charge leakage might corrupt the results of the test.

The test pattern, timing and control signals, such as those depicted in FIG. 14, for example, may be generated by a suitable signal generator of the tester 210 (FIG. 4), or a suitable signal generator of an on-board test circuit 123, or a combination thereof. Similarly, the RX test results may be analyzed by suitable logic of the tester 210 (FIG. 4), or by suitable logic of an on-board test circuit 123 or a combination thereof; to determine the open/good TSV status of each I/O pad. The signal generator and the analysis logic may be implemented in hardware, software, firmware or any appropriate combination thereof.

In one aspect of the present description, method and apparatus are provided for testing defects in through-body-vias such as through-silicon-vias which can facilitate high volume manufacturing. For example, many through-body-vias may be tested in parallel. In addition, each test may be performed relatively quickly, such as ten or fewer clock cycles, for example. Still further, the tests may be performed at a single stage of the manufacturing process. Furthermore, the tests may be relatively insensitive to variations in the manufacturing process and the absolute values of the capacitances at the nodes of the I/O buffers. It is appreciated that in other embodiments in accordance with the present description, through-body-vias may be tested singly and at multiple stages, depending upon the particular application.

Moreover, method and apparatus in accordance with the present description for testing defects in through-body-vias such as through-silicon-vias, may utilize relatively little additional circuitry to perform the tests. Thus, in the illustrated embodiment, the testing circuitry 123 may utilize as few as a single charge sharing pass switch 324 per I/O buffer and as few as a single replica I/O buffer in a channel of an I/O interface of many I/O buffers. Still further, power consumption and current leakage resulting from the testing circuitry may be relatively small or negligible. Other features may be realized in addition to or instead of those described herein, depending upon the particular application.

Additional Embodiment Details

The described techniques for may be embodied as a method, apparatus, computer program product or article of manufacture using standard programming and/or engineering techniques to produce software, firmware, hardware, or any combination thereof. The outputs of on-die circuitry which may include programmable processors, dedicated processors, comparators or adder/subtractor circuits, may be processed by on-die logic circuitry, firmware or software or processed by off chip logic circuitry, firmware or software, or a combination thereof, to process optically transmitted data. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The "article of manufacture" or "computer program product" may comprise the medium in which the code is embodied. Additionally, the "article of manufacture" "computer program product" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, a die having an on board through-body-via testing circuit in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the testing circuit embodiments may be embodied in a computing device that docs not include, for example, a video controller, such as a switch, router, etc, or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

FIG. 15 illustrates one embodiment of a computer architecture 900 of components, any one of which may include a die having an on board testing circuitry for testing through-body vias, in accordance with the present description. The computer architecture 900 may comprise any computing device known in the art, such as a mainframe, server, personal computer, workstation, laptop, handheld computer, telephony device, network appliance, virtualization device, storage controller, etc. The architecture 900 may include a processor 902 (e.g., a microprocessor), a memory 904 (e.g., a volatile memory device), and storage 906 (e.g., a non-volatile storage, such as magnetic disk drives, optical disk drives, a tape drive, etc.). The storage 906 may comprise an internal storage device or an attached or network accessible storage. Programs in the storage 906 are loaded into the memory 904 and executed by the processor 902 in a manner known in the art. The architecture further includes a network controller or adapter 908 to enable communication with a network, such as an Ethernet, a Fibre Channel Arbitrated Loop, etc. Further, the architecture may, in certain embodiments, include a video controller 909 to render information on a display monitor, where the video controller 909 may be embodied on a video card or integrated on integrated circuit components mounted on the motherboard. An input device 910 is used to provide user input to the processor 902, and may include a keyboard, mouse, pen-stylus, microphone, touch sensitive display screen, or any other activation or input mechanism known in the art. An output device 912 is capable of rendering information transmitted from the processor 902, or other component, such as a display monitor, printer, storage, etc.

The network adapter 908 may embodied on a network card, such as a Peripheral Component Interconnect (PCI) card, PCI-express, or some other I/O card, or on integrated circuit components mounted on the motherboard. The storage 906 may comprise an internal storage device or an attached or network accessible storage. Programs in the storage 906 are loaded into the memory 904 and executed by the processor 902. Any one or more of the devices of the computer architecture 900 may include one or more integrated circuits having an on-die conversion testing circuit as described herein.

The foregoing description of various embodiments has been presented for the purposes of illustration and description. It is not intended to be exhaustive or to limit to the precise form disclosed. Many modifications and variations are possible in light of the above teaching.

What is claimed is:
1. A method, comprising:
setting a voltage level of a first through-body-via to a first voltage level;
setting a voltage level of a second through-body-via to a second voltage level lower than the first voltage level;
allowing charges on the first and second through-body-vias to redistribute between them to provide a common, third voltage level on the first and second through-body-vias, said third voltage level being between the first and second voltage levels and a function of the respective capacitances of the first and second through-body-vias; and determining whether the one or both of the first and second through-body-vias has a defect as a function of the common, third voltage level wherein the determining includes comparing the common, third voltage level to a first threshold level lower than the first voltage level, and comparing the common, third voltage level to a second threshold level higher than the second voltage level, wherein said second threshold level is higher than said first threshold level.

2. The method of claim 1 wherein the allowing charges to redistribute includes electrically coupling the first and second through-body-vias together so that the first through-body-via discharges and second through-body-via charges to the common, third voltage level between the first and second voltage levels.

3. The method of claim 1 wherein the common, third voltage level being intermediate between the first and second threshold levels indicates one of a) both through-body-vias having an open condition defect and b) neither through-body-via having an open condition defect.

4. The method of claim 1 wherein the common, third voltage level being lower than the first threshold level indicates the first through-body-via has an open condition defect.

5. The method of claim 1 wherein the common, third voltage level being higher than the second threshold level indicates the second through-body-via has an open condition defect.

6. The method of claim 1 further comprising:
setting a voltage level of a first node having a through-body-via;
setting a voltage level of a second node having a replica of an open condition defect;
allowing charges on the first and second nodes to redistribute between them to provide a common voltage level on the first and second nodes; and
determining whether the first node has an open condition defect as a function of the common voltage level of the first and second nodes.

7. The method of claim 1, further comprising:
setting a voltage level of a first through-body-via of a first plurality of pairs of through-body-vias, to the first voltage level;
setting a voltage level of a second through-body-via of the first plurality of pairs of through-body-vias, to the second voltage level lower than the first voltage level;
allowing charges on the first and second through-body-vias of each pair of the first plurality of pairs to redistribute between them to provide a common voltage level on each pair of the first and second through-body-vias, said common voltage level being between the first and second voltage levels;
determining whether the one or both of the first and second through-body-vias of each pair has an open condition defect as a function of the common voltage level of each pair;
rearranging the through-body-vias of the first plurality of pairs into a second plurality of pairs different from the first plurality of pairs;
setting a voltage level of a first through-body-via of the second plurality of pairs of through-body-vias, to the first voltage level;

setting a voltage level of a second through-body-via of the second plurality of pairs of through-body-vias, to the second voltage level lower than the first voltage level;
allowing charges on the first and second through-body-vias of each pair of the second plurality of pairs to redistribute between them to provide a common voltage level on each pair of the first and second through-body-vias of the second plurality of pairs, said common voltage level being between the first and second voltage levels;
determining whether one or both of the first and second through-body-vias of each pair of the second plurality of pairs has an open condition defect as a function of the common voltage level of each pair of the second plurality of pairs;
setting a voltage level of a first node of a first pair of nodes in which the first node has a through-body-via;
setting a voltage level of a second node of the pair of nodes in which the second node has a replica of an open condition defect;
allowing charges on the first and second nodes to redistribute between them to provide a common voltage level on the first and second nodes; and
determining whether the first node has an open condition defect as a function of the common voltage level of the first and second nodes, to provide a first node result indicating whether the first node has an open condition defect;
wherein a pair of through-body-vias of the second plurality of pairs includes the first node having a through-body-via and a second through-body-via wherein the determining whether the second through-body-via of the pair of the second plurality of pairs has an open condition defect as a function of the common voltage level of the pair of the second plurality of pairs is also a function of the first node result indicating whether the first node has an open condition defect.

8. A device, comprising:
an integrated circuit die, comprising:
a plurality of integrated circuit portions;
a plurality of through-body-vias; and
a testing circuit on board the die and adapted to:
set a voltage level of a first through-body-via of said plurality of through-body-vias to a first voltage level;
set a voltage level of a second through-body-via of said plurality of through-body-vias to a second voltage level lower than the first voltage level;
allow charges on the first and second through-body-vias to redistribute between them to provide a common, third voltage level on the first and second through-body-vias, said third voltage level being between the first and second voltage levels and a function of the respective capacitances of the first and second through-body-vias; and
provide result data indicating whether the one or both of the first and second through-body-vias has a defect as a function of the common, third voltage level;
wherein the testing circuit includes a comparator adapted to compare the common, third voltage level to a first threshold level lower than the first voltage level, and compare the common, third voltage level to a second threshold level higher than the second voltage level, wherein said second threshold level is higher than said first threshold level.

9. The device of claim 8 wherein the testing circuit has a switch adapted to allow charges to redistribute by electrically coupling the first and second through-body-vias together so that the first through-body-via discharges and second through-body-via charges to the common, third voltage level between the first and second voltage levels.

10. The device of claim 8 wherein the comparator provides result data indicating in response to a common, third voltage level being intermediate between the first and second threshold levels, that one of a) both through-body-vias have an open condition defect and b) neither through-body-via has an open condition defect.

11. The device of claim 8 wherein the comparator provides result data indicating in response the common, third voltage level being lower than the first threshold level, that the first through-body-via has an open condition defect.

12. The device of claim 8 wherein the comparator provides result data indicating in response the common, third voltage level being higher than the second threshold level, that the second through-body-via has an open condition defect.

13. The device of claim 8 wherein the integrated circuit die further comprises a first node having a through-body-via, and a second node have a replica of an open condition defect; and wherein the testing circuit is further adapted to:
set a voltage level of the first node having a through-body-via;
set a voltage level of the second node having a replica of an open condition defect;
allow charges on the first and second nodes to redistribute between them to provide a common voltage level on the first and second nodes; and
provide result data indicating whether the first node has an open condition defect as a function of the common voltage level of the first and second nodes.

14. The device of claim 8, further comprising a first plurality of pairs of through-body-vias, and wherein the testing circuit is further adapted to:
set a voltage level of a first through-body-via of the first plurality of pairs of through-body-vias, to the first voltage level;
set a voltage level of a second through-body-via of the first plurality of pairs of through-body-vias, to the second voltage level lower than the first voltage level;
allow charges on the first and second through-body-vias of each pair of the first plurality of pairs to redistribute between them to provide a common voltage level on each pair of the first and second through-body-vias, said common voltage level being between the first and second voltage levels;
provide first plurality pair result data indicating whether the one or both of the first and second through-body-vias of each pair of the first plurality of pairs has an open condition defect as a function of the common voltage level of each pair;
rearrange the through-body-vias of the first plurality of pairs into a second plurality of pairs different from the first plurality of pairs;
set a voltage level of a first through-body-via of the second plurality of pairs of through-body-vias, to the first voltage level;
set a voltage level of a second through-body-via of the second plurality of pairs of through-body-vias, to the second voltage level lower than the first voltage level;
allow charges on the first and second through-body-vias of each pair of the second plurality of pairs to redistribute between them to provide a common voltage level on each pair of the first and second through-body-vias of the second plurality of pairs, said common voltage level being between the first and second voltage levels; and
provide second plurality pair result data indicating whether one or both of the first and second through-body-vias of each pair of the second plurality of pairs has an open condition defect as a function of the common voltage level of each pair of the second plurality of pairs;
wherein the integrated circuit die further comprises a first node having a through-body-via, and a second node have a replica of an open condition defect; and wherein the testing circuit is further adapted to:
set a voltage level of a first node of a first pair of nodes in which the first node has a through-body-via;
set a voltage level of a second node of the pair of nodes in which the second node has a replica of an open condition defect;
allow charges on the first and second nodes to redistribute between them to provide a common voltage level on the first and second nodes; and
provide first node result data indicating whether the first node has an open condition defect as a function of the common voltage level of the first and second nodes;
wherein a pair of through-body-vias of the second plurality of pairs includes the first node having a through-body-via and a second through-body-via, the device further comprising logic circuitry adapted to determine whether the first node has an open condition defect as a function of the first node result data, and also determine whether the second through-body-via of the pair of the second plurality of pairs has an open condition defect as a function of the second plurality pair result data of the second plurality of pairs also as a function of the first node result data indicating whether the first node has an open condition defect.

15. A system, comprising:
a processor;
a memory coupled to the processor;
a video controller coupled to the processor and the memory; and
a package including an integrated circuit die coupled to the processor and the memory, the integrated circuit die comprising:
a plurality of integrated circuit portions;
a plurality of through-body-vias; and
a testing circuit on board the die and adapted to:
set a voltage level of a first through-body-via of said plurality of through-body-vias to a first voltage level;
set a voltage level of a second through-body-via of said plurality of through-body-vias to a second voltage level lower than the first voltage level;
allow charges on the first and second through-body-vias to redistribute between them to provide a common, third voltage level on the first and second through-body-vias, said third voltage level being between the first and second voltage levels and a function of the respective capacitances of the first and second through-body-vias; and
provide result data indicating whether the one or both of the first and second through-body-vias has a defect as a function of the common, third voltage level;
wherein the testing circuit includes a comparator adapted to compare the common, third voltage level to a first threshold level lower than the first voltage level, and compare the common, third voltage level to a second threshold level higher than the second voltage level, wherein said second threshold level is higher than said first threshold level.

16. The system of claim 15 wherein the testing circuit has a switch adapted to allow charges to redistribute by electrically coupling the first and second through-body-vias together so that the first through-body-via discharges and second through-body-via charges to the common, third voltage level between the first and second voltage levels.

17. The system of claim 15 wherein the comparator provides result data indicating in response to a common, third voltage level being intermediate between the first and second threshold levels, that one of a) both through-body-vias have an open condition defect and b) neither through-body-via has an open condition defect.

18. The system of claim 15 wherein the comparator provides result data indicating in response the common, third voltage level being lower than the first threshold level, that the first through-body-via has an open condition defect.

19. The system of claim 15 wherein the comparator provides result data indicating in response the common, third voltage level being higher than the second threshold level, that the second through-body-via has an open condition defect.

20. The system of claim 15 wherein the integrated circuit die further comprises a first node having a through-body-via, and a second node have a replica of an open condition defect; and wherein the testing circuit is further adapted to:
set a voltage level of the first node having a through-body-via;
set a voltage level of the second node having a replica of an open condition defect;
allow charges on the first and second nodes to redistribute between them to provide a common voltage level on the first and second nodes; and
provide result data indicating whether the first node has an open condition defect as a function of the common voltage level of the first and second nodes.

21. The system of claim 15, further comprising a first plurality of pairs of through-body-vias, and wherein the testing circuit is further adapted to:
set a voltage level of a first through-body-via of the first plurality of pairs of through-body-vias, to the first voltage level;
set a voltage level of a second through-body-via of the first plurality of pairs of through-body-vias, to the second voltage level lower than the first voltage level;
allow charges on the first and second through-body-vias of each pair of the first plurality of pairs to redistribute between them to provide a common voltage level on each pair of the first and second through-body-vias, said common voltage level being between the first and second voltage levels;
provide first plurality pair result data indicating whether the one or both of the first and second through-body-vias of each pair of the first plurality of pairs has an open condition defect as a function of the common voltage level of each pair;
rearrange the through-body-vias of the first plurality of pairs into a second plurality of pairs different from the first plurality of pairs;
set a voltage level of a first through-body-via of the second plurality of pairs of through-body-vias, to the first voltage level;
set a voltage level of a second through-body-via of the second plurality of pairs of through-body-vias, to the second voltage level lower than the first voltage level;
allow charges on the first and second through-body-vias of each pair of the second plurality of pairs to redistribute between them to provide a common voltage level on each pair of the first and second through-body-vias of the second plurality of pairs, said common voltage level being between the first and second voltage levels; and
provide second plurality pair result data indicating whether one or both of the first and second through-body-vias of each pair of the second plurality of pairs has an open condition defect as a function of the common voltage level of each pair of the second plurality of pairs;
wherein the integrated circuit die further comprises a first node having a through-body-via, and a second node have a replica of an open condition defect; and wherein the testing circuit is further adapted to:
set a voltage level of a first node of a first pair of nodes in which the first node has a through-body-via;
set a voltage level of a second node of the pair of nodes in which the second node has a replica of an open condition defect;
allow charges on the first and second nodes to redistribute between them to provide a common voltage level on the first and second nodes; and
provide first node result data indicating whether the first node has an open condition defect as a function of the common voltage level of the first and second nodes;
wherein a pair of through-body-vias of the second plurality of pairs includes the first node having a through-body-via and a second through-body-via, the system further comprising logic circuitry adapted to determine whether the first node has an open condition defect as a function of the first node result data, and also determine whether the second through-body-via of the pair of the second plurality of pairs has an open condition defect as a function of the second plurality pair result data of the second plurality of pairs also as a function of the first node result data indicating whether the first node has an open condition defect.

\* \* \* \* \*